United States Patent
Reohr et al.

(10) Patent No.: US 8,120,968 B2
(45) Date of Patent: Feb. 21, 2012

(54) HIGH VOLTAGE WORD LINE DRIVER

(75) Inventors: William Robert Reohr, Ridgefield, CT (US); John Edward Barth, Jr., Williston, VT (US); Toshiaki Kirihata, Poughkeepsie, NY (US); Derek H. Leu, Stormville, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 12/704,703

(22) Filed: Feb. 12, 2010

(65) Prior Publication Data

US 2011/0199837 A1   Aug. 18, 2011

(51) Int. Cl.
 *G11C 16/06* (2006.01)
(52) U.S. Cl. ......... 365/185.23; 365/189.06; 365/189.07; 365/185.05; 365/189.11
(58) Field of Classification Search ............. 365/185.23, 365/189.06, 189.11, 189.07, 185.05
See application file for complete search history.

(56) References Cited

U.S. PATENT DOCUMENTS

| | | | |
|---|---|---|---|
| 5,345,422 A * | 9/1994 | Redwine ................ | 365/189.09 |
| 5,748,556 A | 5/1998 | Iyengar | |
| 6,242,936 B1 * | 6/2001 | Ho et al. ................ | 365/182 |
| 6,343,044 B1 | 1/2002 | Hsu et al. | |
| 6,373,753 B1 | 4/2002 | Proebsting | |
| 6,535,430 B2 | 3/2003 | Ogura et al. | |
| 7,038,937 B2 | 5/2006 | Lines | |
| 7,277,315 B2 | 10/2007 | Yuan et al. | |
| 7,372,739 B2 | 5/2008 | Macerola | |
| 7,447,105 B2 | 11/2008 | Lee | |
| 7,701,263 B2 | 4/2010 | Kumar et al. | |
| 7,969,780 B2 * | 6/2011 | Ogura et al. ............ | 365/185.08 |
| 2007/0086248 A1 | 4/2007 | Daga | |
| 2007/0159909 A1 * | 7/2007 | Frederick .............. | 365/228 |
| 2008/0056021 A1 | 3/2008 | Kobayashi | |
| 2010/0220541 A1 * | 9/2010 | Gebara et al. .......... | 365/226 |

OTHER PUBLICATIONS

R.C. Foss et al., "Application of a High-Voltage Pumped Supply for Low-Power DRAM," Symposium on VLSI Circuits Digest of Technical Papers, Jun. 1992, pp. 106-107.

* cited by examiner

*Primary Examiner* — Tuan T. Nguyen
(74) *Attorney, Agent, or Firm* — Preston J. Young; Otterstedt, Ellenbogen & Kammer, LLP

(57) ABSTRACT

A word line driver circuit coupled to a memory circuit word line includes pull-up, pull-up clamp, pull-down and pull-down clamp transistors, each having a source, a drain and a gate. For the pull-up transistor, the source is coupled to a first power supply, and the gate to a pull-up control signal. For the pull-up clamp transistor, the source is coupled to the drain of the pull-up transistor, the drain to the word line, and the gate to a pull-up clamp gate signal. For the pull-down transistor, the source is coupled to a second power supply, and the gate to a pull-down control signal. For the pull-down clamp transistor, the source is coupled to the drain of the pull-down transistor, the drain to the word line, and the gate to a pull-down clamp gate signal. The word line is coupled to one or more DRAM cells. Source to drain voltage magnitudes of the pull-up and pull-down transistors are less than a voltage between the first and second power supplies.

22 Claims, 11 Drawing Sheets

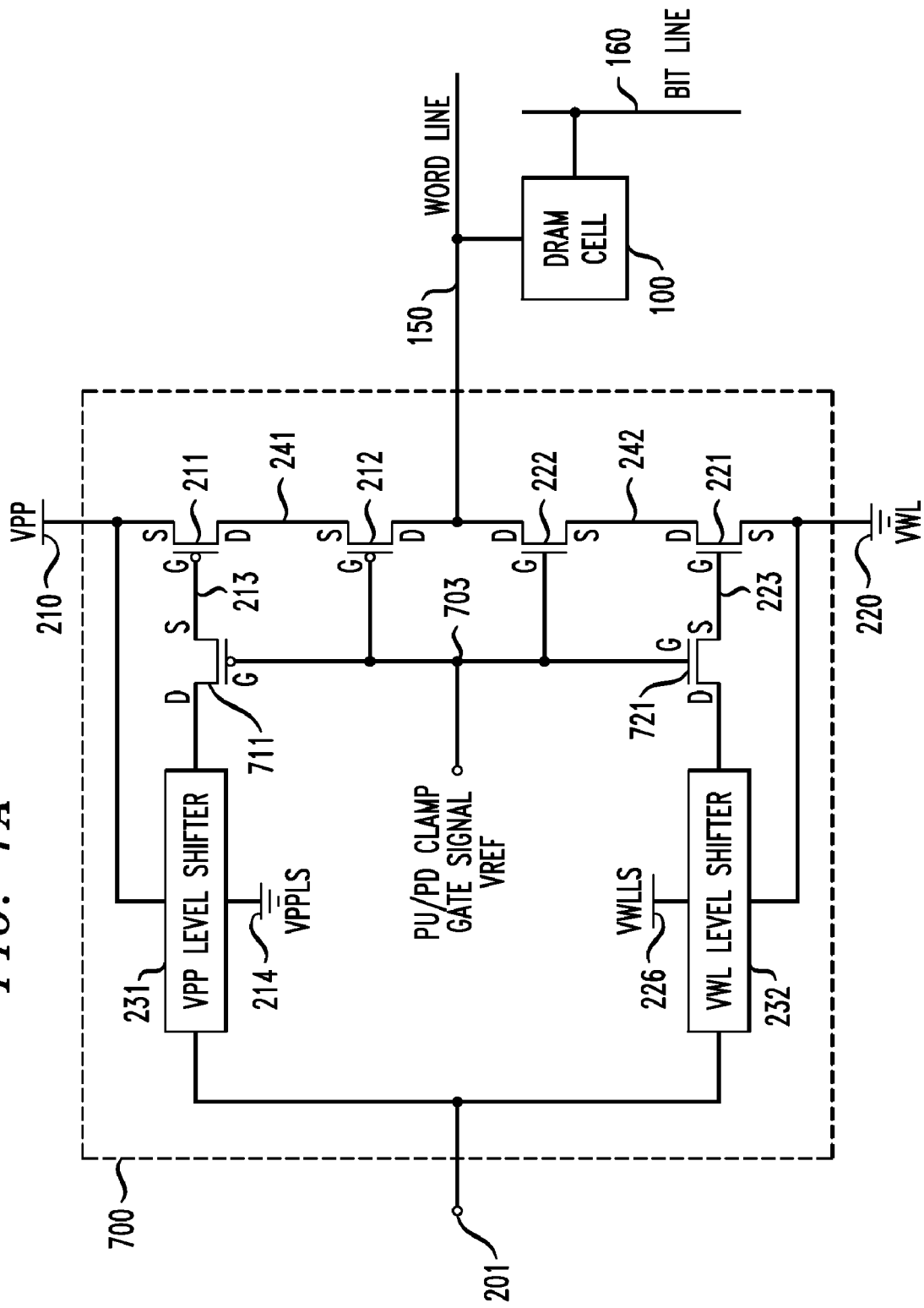

800

HIGH VOLTAGE WORD LINE DRIVER

STATEMENT OF GOVERNMENT RIGHTS

This invention was made with Government support under Contract No. HR0011-07-9-0002 awarded by the Defense Advanced Research Projects Agency (DARPA). The Government has certain rights in this invention.

FIELD OF THE INVENTION

The present invention relates generally to the electrical, electronic, and computer arts, and more particularly relates to word line driver circuits for use in a memory device.

BACKGROUND OF THE INVENTION

Memory circuits typically include a memory array comprising a plurality of memory cells coupled to an arrangement of word lines and bit lines, each memory cell being coupled to a corresponding unique word line and bit line pair. There may be a plurality of memory cells coupled to a given word line and/or a given bit line. The term "word line" as used in the context of a memory array is sometimes referred to as a "row." Similarly, the term "bit line" in the contact of a memory array is sometimes referred to as a "column." It is to be understood that the terms "word line" and "bit line" as used herein are intended to have the same meaning as, and may therefore be used interchangeably with, the terms "row" and "column," respectively.

A word line driver circuit is typically coupled to each word line in the memory circuit. Within the memory array, one word line is typically activated (i.e., in an active mode) at a given time to access (e.g., read, write or refresh) memory cells coupled to the activated word line. At that time, the other word lines in the memory circuit remain inactive (i.e., in a standby mode). The voltage on an activated word line is controlled by a word line driver circuit coupled to the activated word line. Deactivated word lines are each held at a standby voltage level by corresponding word line driver circuits coupled to the respective deactivated word lines. The selection of an active word line is determined by a word line address signal supplied to a word line decoder in the memory circuit. The word line decoder selectively activates the word line driver circuit coupled to the addressed word line. The design and operation of conventional memory arrays and conventional memory circuits is well known in the art.

It is often desirable, particularly in the context of a dynamic random access memory (DRAM), to apply higher voltages to the memory cells when writing the cells to a logic high state. The use of higher write voltages advantageously enables the memory cell to store more charge or, in other words, more signal. With more signal, various combinations of improvements in memory capacity (i.e., density), latency, cycle time, and retention time, etc., may be realized. Unfortunately, higher voltages applied to the memory cells can damage transistors associated with these cells over time. For this reason, reliability limitations are specified for field-effect transistors (FETs) in order to constrain voltages across their source-to-drain regions and gate-to-source/drain regions so that these transistors, operated under such constraints, will not experience breakdown during their operable lifetime. These reliability constraints, however, prevent conventional memory circuits from achieving the above-stated benefits of using higher word line voltages.

SUMMARY OF THE INVENTION

Principles of the invention provide a high voltage word line driver circuit for use, for example, in a DRAM array. Advantageously, embodiments of the invention provide a word line driver comprising an output drive stage including thin-oxide (logic) transistors adapted for driving voltages on a corresponding word line of the memory array that are greater than otherwise supported by individual thin-oxide transistors.

In accordance with one aspect of the invention, a word line driver circuit adapted for connection to a corresponding word line in a memory circuit is provided. The word line driver circuit comprises: a first transistor including a first source/drain coupled to a first voltage supply at a first voltage level, a second source/drain, and a gate adapted to receive a first control signal which varies as a function of an input signal supplied to the word line driver circuit; a second transistor including a first source/drain connected to the second source/drain of the first transistor, a second source/drain coupled to the corresponding word line, and a gate adapted to receive a first clamp signal; a third transistor including a first source/drain coupled to the corresponding word line, a second source/drain, and a gate adapted to receive a second clamp signal; and a fourth transistor including a first source/drain connected to the second source/drain of the third transistor, a second source/drain coupled to a second voltage supply at a second voltage level, and a gate adapted to receive a second control signal which varies as a function of the input signal. The first clamp signal is set to a third voltage level configured such that a voltage difference between the first and second source/drains of the first transistor is less than a voltage difference between the first and second voltage supplies. The second clamp voltage is set to a fourth voltage level configured such that a voltage difference between the first source/drain and the second source/drain of the fourth transistor is less than the voltage difference between the first and second voltage supplies.

In accordance with another aspect of the invention, a memory circuit includes at least one word line, at least one memory cell coupled to the word line, and at least one word line driver circuit coupled to the word line. The word line driver circuit comprises: a first transistor including a first source/drain coupled to a first voltage supply providing a first voltage level, a second source/drain, and a gate adapted to receive a first control signal which varies as a function of an input signal supplied to the word line driver circuit; a second transistor including a first source/drain connected to the second source/drain of the first transistor, a second source/drain coupled to the corresponding word line, and a gate adapted to receive a first clamp signal; a third transistor including a first source/drain coupled to the corresponding word line, a second source/drain, and a gate adapted to receive a second clamp signal; and a fourth transistor including a first source/drain connected to the second source/drain of the third transistor, a second source/drain coupled to a second voltage supply providing a second voltage level, and a gate adapted to receive a second control signal which varies as a function of the input signal. The first clamp signal is set to a third voltage level configured such that a voltage difference between the first and second source/drains of the first transistor is less than a voltage difference between the first and second voltage supplies. The second clamp voltage is set to a fourth voltage level configured such that a voltage difference between the first source/drain and the second source/drain of the fourth transistor is less than the voltage difference between the first and second voltage supplies.

In accordance with yet another aspect of the invention, an integrated circuit includes an embedded memory and at least one word line driver circuit connected to a corresponding word line in the embedded memory. The word line driver circuit comprises: a first transistor including a first source/ drain coupled to a first voltage supply providing a first voltage level, a second source/drain, and a gate adapted to receive a first control signal which varies as a function of an input signal supplied to the word line driver circuit; a second transistor including a first source/drain connected to the second source/drain of the first transistor, a second source/drain coupled to the corresponding word line, and a gate adapted to receive a first clamp signal; a third transistor including a first source/drain coupled to the corresponding word line, a second source/drain, and a gate adapted to receive a second clamp signal; and a fourth transistor including a first source/drain connected to the second source/drain of the third transistor, a second source/drain coupled to a second voltage supply providing a second voltage level, and a gate adapted to receive a second control signal which varies as a function of the input signal. The first clamp signal is set to a third voltage level configured such that a voltage difference between the first and second source/drains of the first transistor is less than a voltage difference between the first and second voltage supplies. The second clamp voltage is set to a fourth voltage level configured such that a voltage difference between the first source/drain and the second source/drain of the fourth transistor is less than the voltage difference between the first and second voltage supplies.

These and other features, objects and advantages of the present invention will become apparent from the following detailed description of illustrative embodiments thereof, which is to be read in conjunction with the accompanying drawings.

BRIEF DESCRIPTION OF THE DRAWINGS

The following drawings are presented by way of example only and without limitation, wherein:

FIG. 7A is a schematic diagram depicting at least a portion of an exemplary word line driver circuit including a pull-up gate clamp transistor and a pull-down gate clamp transistor, according to an embodiment of the present invention;

Figure 1A:
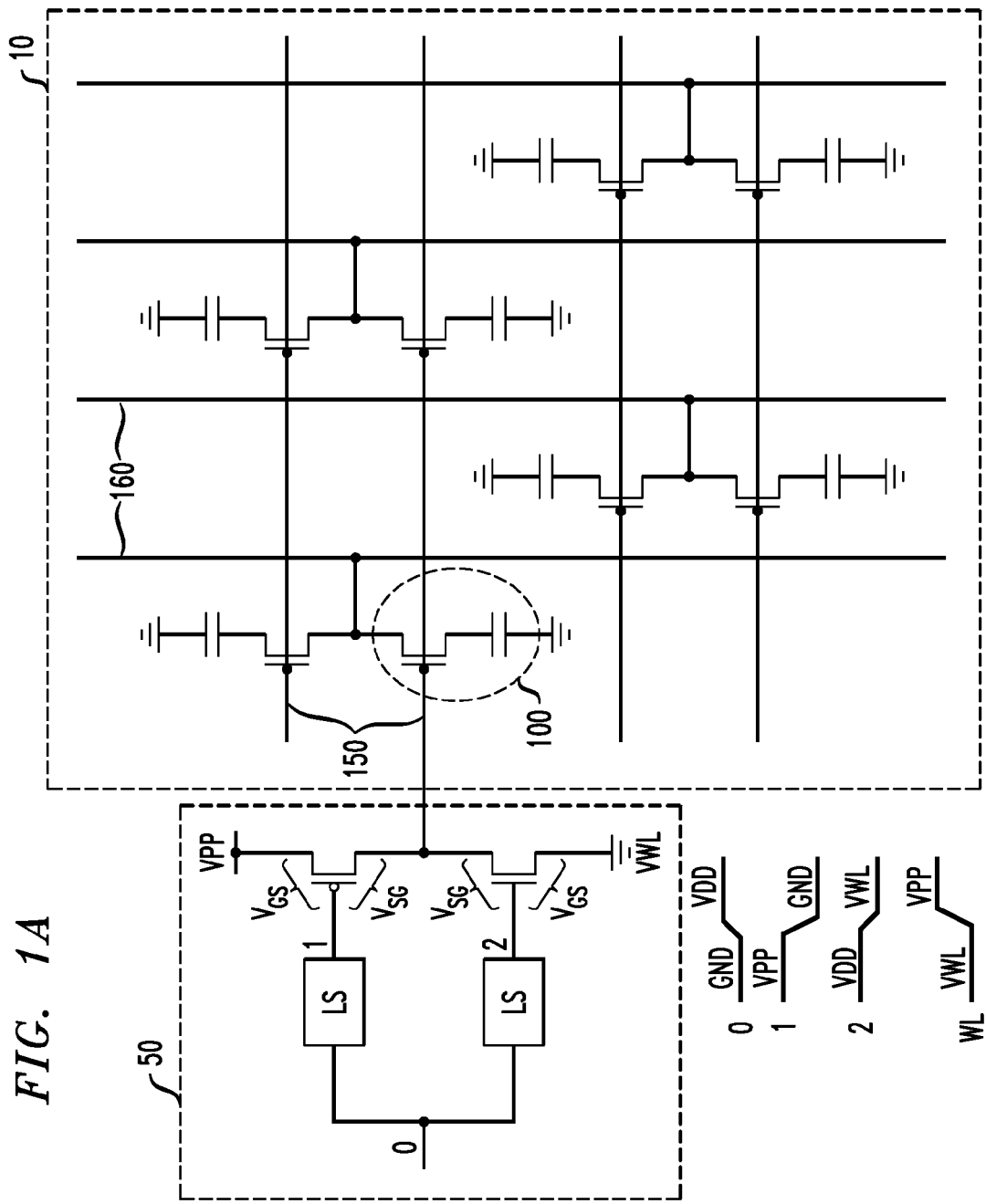
FIG. 1A is a schematic diagram depicting a portion of an illustrative dynamic random access memory circuit.

It is to be appreciated that elements in the figures are illustrated for simplicity and clarity. Common but well-understood elements that may be useful or necessary in a commercially feasible embodiment may not be shown in order to facilitate a less obstructed view of the illustrated embodiments.

DETAILED DESCRIPTION OF PREFERRED EMBODIMENTS

It is generally known to use cascode circuits to implement logic functions in complementary metal-oxide-semiconductor (CMOS) circuits. However, a cascoded driver arrangement is not conventionally employed in an output stage of a deep submicron DRAM word line driver circuit for managing voltages across the terminals of the FETs therein. In this regard, it should be understood that FET channel lengths for deep submicron CMOS (e.g., 45-nanometer (nm) lithography) are becoming fixed (or constrained to a narrow band of values around a nominal length) for lithographic reasons and that transistors serve multiple purposes: (i) for the embedded DRAM circuits themselves; for analog circuits; and (ii) for input/output (I/O) circuits. Historically, if there were a source/drain reliability constraint imposed, for example, transistor channel lengths were extended to mitigate the problem without significantly impacting the physical area of the integrated circuit. Moreover, for stand-alone (i.e., discrete) memories, more targeted solutions were devised that involved specifying FET dimensions and characteristics for a specific application, like a word line driver application, which may occupy 20 percent of the overall chip area.

In light of the foregoing historical circuit development, introducing additional transistors in the output stage of a word line driver circuit for managing voltages—these largest transistors being introduced within each word line driver circuit—is generally not desirable, especially considering their impact to the overall design, at least in terms of cost and performance. For an area-neutral design, the increase in transistor impedance using a cascade arrangement is about four times (two half-width transistors in series) compared to designs that do not use a cascode architecture. As a consequence, word line rise and fall times also increase by a factor of four, thereby increasing latency and random access cycle time in the embedded DRAM circuit. This alone would dissuade using a cascode arrangement in the context of a DRAM word line driver application, absent the teachings of the present invention described below.

Principles of the present invention will be described herein in the context of illustrative embodiments of a memory word line driver circuit suitable for use in a DRAM. It is to be appreciated, however, that the invention is not limited to the specific apparatus and methods illustratively shown and described herein. Rather, aspects of the invention are directed broadly to techniques for overcoming breakdown voltage limitations in a word line driver circuit by reducing peak voltages across one or more transistors in an output stage of the word line driver circuit. In this manner, aspects of the invention facilitate the use of voltages generated by the word line driver circuit, and applied to corresponding word lines in the memory circuit, that are higher than can otherwise be tolerated by individual transistors in the driver circuit without incurring damage or impacting reliability. It will become apparent to those skilled in the art given the teachings herein that numerous modifications can be made to the embodiments shown that are within the scope of the present invention. That is, no limitations with respect to the specific embodiments described herein are intended or should be inferred.

Memory circuits may be fabricated by semiconductor processing, such as, for example, bulk silicon or silicon-on-insulator (SOI) semiconductor fabrication. Such semiconductor fabrication methodologies are well known in the art. Embedded memories may be fabricated by semiconductor processing technologies used to fabricate logic devices and logic circuits. Such semiconductor processing technologies may be referred to as logic fabrication technologies. Some, but not necessarily all, embedded memories may require processing steps in substitution for, or addition to, those processing steps required by logic fabrication technologies. For example, forming DRAM cells may require extra processing steps known to those skilled in the art. Logic fabrication technologies may be known by their lithographic dimensions. Such logic fabrication technologies, for example, 45-nanometer (nm) or 30-nm technologies, may be used to fabricate memory circuits according to embodiments of the invention.

Although reference may be made herein to n-channel metal-oxide-semiconductor (NMOS) or p-channel metal-oxide-semiconductor (PMOS) field-effect transistor (FET) devices which may be formed using a complementary metal-oxide-semiconductor (CMOS) IC fabrication process, the invention is not limited to such devices and/or such an IC fabrication process. Furthermore, although preferred embodiments of the invention may be fabricated in a silicon wafer, embodiments of the invention can alternatively be fabricated in wafers comprising other materials, including but not limited to gallium arsenide (GaAs), indium phosphide (InP), etc.

Aspects of the present invention advantageously provide a memory circuit, or components thereof, having improved performance and reliability. The memory circuit may comprise, for example, an embedded memory (e.g., a memory embedded within an IC) or a stand-alone (e.g., discrete) memory (e.g., a memory that is the primary component within an IC). The memory is preferably a volatile memory, examples of which include static random access memory (SRAM) and DRAM. Memories and their associated memory cells may be comprised of various types, including, but not limited to, volatile, nonvolatile, static, dynamic, read only, random access, flash, one-time programmable, multiple-time programmable, magnetoresistive phase-change memory (PCM), etc. Embedded memories are incorporated within a larger functional block, generally termed a logic circuit, for example, a microprocessor, a digital processing device, a field programmable gate array (FPGA), an application-specific integrated circuit (ASIC), etc.

Standard IC fabrication technologies generally provide at least two different types of transistors. Input/output (I/O) transistors are an example of a first type. I/O transistors are designed to operate in a relatively high voltage environment, such as, for example, a 1.7-volt (V) nominal environment. In order to withstand the relatively high voltage without gate oxide breakdown, I/O transistors are formed having a relatively thick gate oxide, such as, for example, greater than about 50 angstroms thick and relatively long channel lengths (e.g., about twice the length of thin-oxide transistors). Therefore, the first type of transistor, which is able to withstand relatively high voltages and has relatively thick gate oxide, may be referred to herein as a "thick-oxide transistor" or "thick-oxide FET."

Alternatively, logic transistors are an example of a second type of transistor provided in standard IC fabrication technologies. Logic transistors are designed to operate in a lower voltage environment, such as, for example, a 1.1-volt nominal environment. Because the voltages applied to these transistors are lower than the voltages applied to a thick-oxide transistor, the gate oxide of logic transistors does not need to be as thick compared to the gate oxide of a thick-oxide device. For example, the gate oxide thickness of a typical logic transistor may be only about 10 to 12 angstroms and the channel length short (e.g., at a minimum specified lithographic dimension). Therefore, the second type of transistor, which is able to withstand only relatively low voltages and has relatively thin gate oxide, may be referred to herein as a "thin-oxide transistor" or "thin-oxide FET." Note, that the thin-oxide transistor is generally used in embedded memory circuits, for example, in embedded SRAM and DRAM circuits.

As is well known by those skilled in the art, a FET comprises a source, a drain and a gate. The FET is non-conductive or "off" (i.e., in an off state) when the magnitude of the gate-to-source voltage ($V_{GS}$) of the FET is less than a threshold voltage ($V_T$) of the FET, so that there is essentially no active conduction (i.e., active current flow) in a channel region established between the source and drain of the FET. The FET is conductive or "on" (i.e., in an on state) when the magnitude of the gate-to-source voltage of the FET is equal to or greater than the threshold voltage of the FET, so that there is active conduction between the source and drain of the FET. A FET may additionally, but not necessarily, have a typically small, but measurable, sub-threshold or leakage current flowing between the source and drain of the FET when the FET is biased in the off state.

Because of the thicker gate oxide, thick-oxide transistors generally have less gain and are therefore significantly slower in charging up a given capacitance to a prescribed voltage level compared to thin-oxide transistors. Therefore, it is generally preferable, at least from a speed perspective, to use thin-oxide transistors rather than thick-oxide transistors wherever possible in a DRAM design.

As previously stated, in the context of a DRAM it is often desirable to use higher voltages (e.g., VPP) applied to the memory cells when writing the cells to a logic high state (e.g., logic "1"). VPP is preferably set to voltage level greater than or about equal to the bit line voltage, which may be VDD, plus a threshold voltage ($V_{Ta}$) of an access transistor in the corresponding memory cell, or higher. Using VPP≧(VDD+$V_{Ta}$) allows a full bit line voltage to be written to the memory cell without having the access transistor impact the stored voltage, where $V_{Ta}$ includes the nominal voltage setting plus worst case $V_{Ta}$ threshold fluctuations of a non-ideal FET). However, scaling VPP to a higher voltage in this way will increase the gate oxide stress (Gox) of the access transistor. In order to overcome this fundamental problem, a negative word line (WL) architecture is preferably used for nano-scale DRAM. Using a negative WL architecture, a word line swings from a negative word line voltage, which may be VWL, to a boosted word line voltage, which may be VPP. This arrangement enables the combined threshold voltage $V_{Ta}$ and boosted word line voltage VPP to be reduced by an amount about equal to the negative word line VWL. A device leakage problem, resulting from utilizing a lower $V_{Ta}$ (which translates into a retention time issue), is resolved with the negative word line architecture. Device stress on the memory cell access transistor can also be reduced because the gate-to-source voltage ($V_{GS}$) applied to the access transistor is determined by the maximum word line voltage VPP and a minimum bit line (BL) voltage, which may be GND when the word line is turned on, which resolves the oxide reliability problem, to a degree, for the access transistors.

Unfortunately, however, the negative WL architecture requires a unique design for the WL drivers. An inverter, which allows for the swinging from VWL to VPP, is not feasible for standard word line drivers primarily because the $V_{GS}$ of the transistors will be VWL+VPP, which is too large a voltage across the relatively thin gate oxide ($G_{OX}$) of the transistors in the word line drivers. Using a transistor with thicker gate oxide compared to transistors used for the rest of the memory array can overcome this problem, but is expensive.

FIG. 1A is a schematic diagram depicting a portion of an illustrative DRAM circuit. The DRAM circuit includes a memory array 10 including a plurality of memory cells 100 and a plurality of word lines 150 and bit lines 160 operatively coupled to the memory cells for selectively accessing the cells. Each of the word lines 150 is preferably coupled to a corresponding word line driver 50, of which only one word line driver is shown for clarity. Word line driver 50 comprises an output stage including a PMOS transistor and an NMOS transistor coupled together in series between voltage supplies VPP and VWL, as shown. The output stage transistors in this exemplary embodiment are driven by a pair of voltage level shifters (LS) connected in common to an input node (node 0) of the word line driver 50. One of the level shifters (top LS) may be a VPP level shifter ($LS_{VPP}$) and the other level shifter (bottom LS) may be a VWL level shifter ($LS_{VWL}$).

This dual level shifter approach is used to reduce the stress of the NMOS and PMOS devices in the word line driver 50. In this configuration, the $LS_{VPP}$ converts the GND-to-VDD input signal (node 0) to a VPP-to-GND output signal (node 1), thereby reducing the gate-to-source voltage $V_{GS}$ of the PMOS transistor to a maximum of VPP. Similarly, the $LS_{VWL}$ converts the GND-to-VDD input signal (node 0) to a VDD-to-VWL output signal (node 2), thereby reducing the $V_{GS}$ of the NMOS transistor to VDD+VWL. The dual level shifter structure reduces the gate-to-source voltage ($V_{GS}$) reliability concern in the WL driver devices. However, even with this dual level shifter approach, the source-to-gate voltage ($V_{SG}$) of the WL driver can be VPP+VWL, which is undesirable.

Figure 1B:
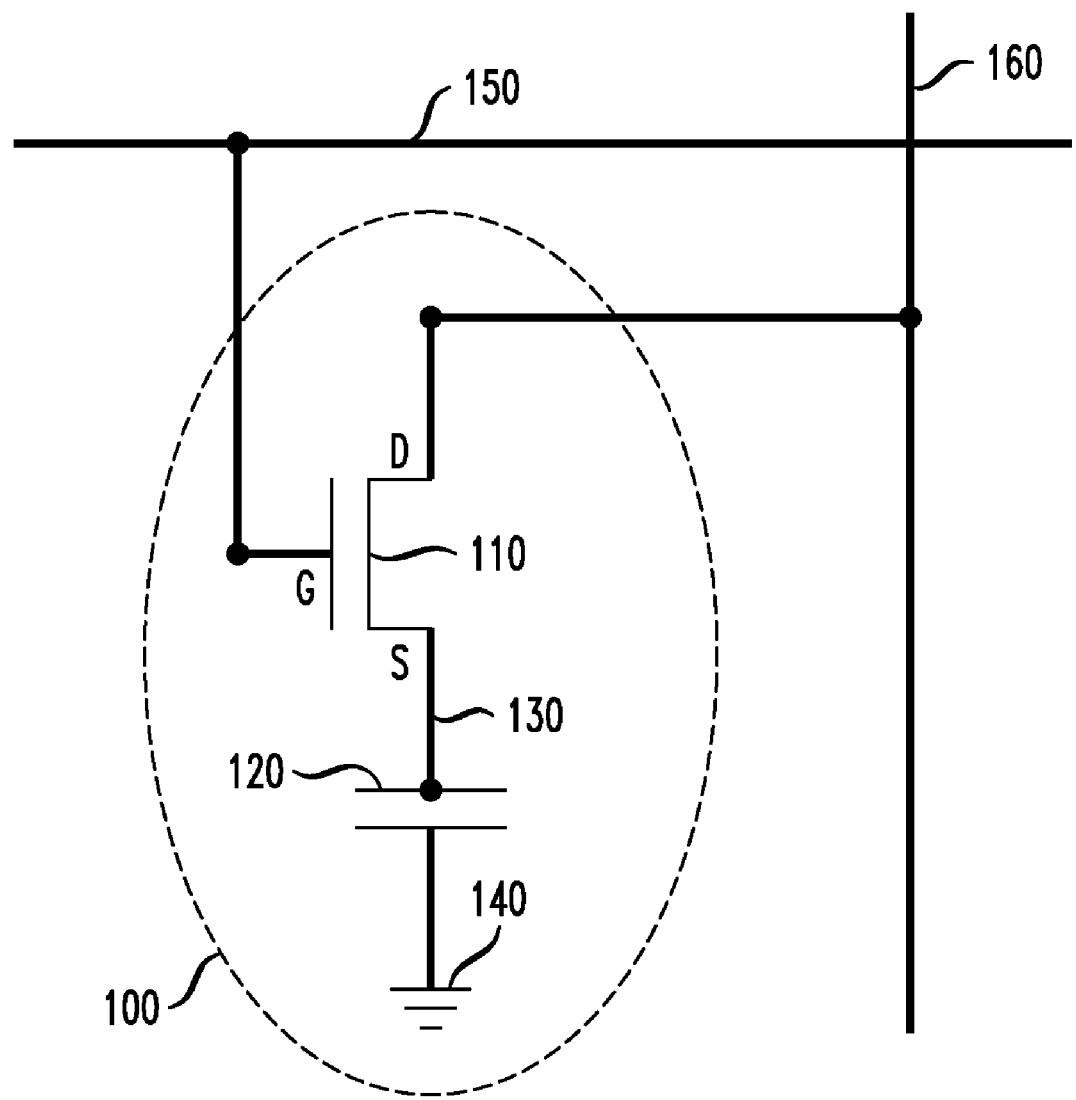
FIG. 1B is a schematic diagram depicting an illustrative dynamic random access memory cell which may be used in the memory circuit of FIG. 1A.

FIG. 1B is a schematic diagram depicting an illustrative DRAM cell 100 which may be utilized in the DRAM circuit shown in FIG. 1A. As apparent from the figure, DRAM cell 100 includes an NMOS access transistor 110 and a storage capacitor 120 operative to at least temporarily store a logical (data) state of the cell. A drain (D) of the access transistor 110 is coupled to a corresponding bit line 160, a source (S) of transistor 110 is coupled to a storage node 130, and a gate (G) of transistor 110 is coupled to a corresponding word line 150. A first terminal of the storage capacitor 120 is coupled to the storage node 130 and a second terminal of the storage capacitor is coupled to voltage supply 140, which may be ground (GND) or 0 volts. When used in a memory array (e.g., memory array 10 shown in FIG. 1A) including a plurality of memory cells, each cell is typically coupled to a unique bit line 160 and word line 150 pair.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

The access transistor 110 in DRAM cell 100 is configured as a source follower when the data is written to the cell capacitor 130 through the access transistor 110, and thus the voltage on the storage node 130 may be limited to a maximum of the voltage applied to the gate of the transistor, via word line 150, minus a threshold voltage ($V_t$) of the transistor. This arrangement in turn limits the peak voltage that can be written into, or stored within, the storage capacitor 120 of cell 100. Using a word line voltage substantially higher than a voltage applied to the bit line 160 may enable the DRAM memory cell 100 to store more charge than when the word line voltage is equal to the bit line voltage.

By way of example only, the storage capacitor 120 in DRAM cell 100 may have a capacitance of about 18 femtofarads (fF) and the access transistor 110 may have a threshold voltage of about 250 millivolts (mV). Raising the voltage applied to the word line 150 about 250 mV above the bit line voltage enables writing a voltage into the cell 100 that is about equal to the bit line voltage, after taking the threshold voltage of the transistor 100 into account. For a cell having a capacitance of about 18 if, the 250 mV increase in cell storage voltage provides about 4.5 femtocoulombs additional charge stored in the storage capacitor 120. It should be appreciated that threshold voltage fluctuations and other non-idealities—for example, those arising from the statistical distribution of dopants, etc.—can account for about an additional 250 mV of threshold beyond the nominal threshold voltage, the new threshold voltage being about 500 mV. For the remainder of this description, however, the 250 mV threshold voltage will be used for illustration purposes only.

Figure 2:
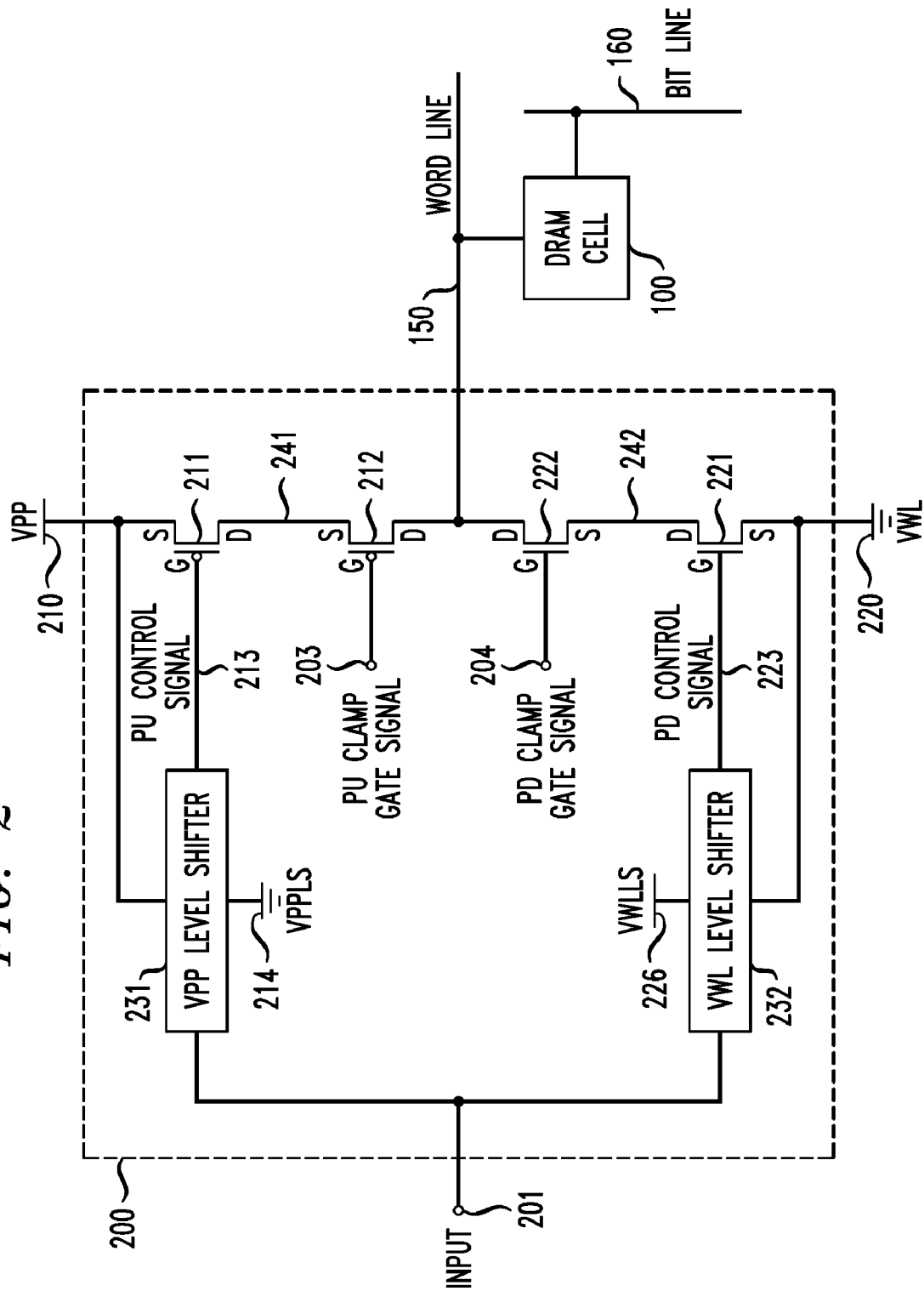
FIG. 2 is a schematic diagram depicting at least a portion of an exemplary word line driver circuit coupled to at least one DRAM cell, according to an embodiment of the present invention.

With reference now to FIG. 2, a schematic diagram depicting at least a portion of an exemplary word line driver circuit 200 coupled to at least one DRAM cell 100 is shown, according to an embodiment of the invention. DRAM cell 100 is indicative of the illustrative DRAM cell 100 shown in FIG. 1, although the invention is not limited to any particular memory cell arrangement and/or type. Moreover, although only a single DRAM cell 100 is shown, the invention is not limited to any specific number of cells that may be coupled to a given word line. In a typically DRAM array, there may be a plurality of memory cells 100 coupled to a given word line 150, with each of the plurality of memory cells 100 connected along the word line being coupled to a separate corresponding bit line 160. Memory circuits, including DRAM circuits, typically comprise a plurality of word line driver circuits (e.g., word line driver circuits according to embodiments of the invention), each word line driver circuit being coupled to and driving a corresponding one of the plurality of word lines in the memory circuit.

Word line driver circuit 200 overcomes breakdown voltage limitations which may be present in conventional word line driver circuits by advantageously reducing peak voltages between any pair of terminals of each MOS transistor device in the word line driver circuit (e.g., between source and drain, source and gate, and drain and gate terminal pairs of each MOS device). Thus, the word line driver circuit 200 is able to supply higher word line voltage levels for writing the memory cells 100, compared to standard word line driver circuits, without incurring device breakdown (e.g., due to high gate-to-source voltage) or other damage to its constituent transistors, which could undesirably impact circuit performance and/or reliability.

Word line driver circuit 200 includes a first PMOS transistor 211, a second PMOS transistor 212, a first NMOS transistor 221 and a second NMOS transistor 222 connected together in series (cascade) between a first voltage supply 210, which may be VPP, and a second voltage supply 220, which may be VWL, with VPP being greater than VWL. In an illustrative embodiment, VPP may be about 1.75 volts nominally and VWL may be about −0.35 volts nominally, although the invention is not limited to any specific voltage levels for these voltage supplies. Transistor 211 may be considered a pull-up device, transistor 212 may be considered a pull-up clamp device, transistor 221 may be considered a pull-down device, and transistor 222 may be considered a pull-down clamp device. Transistors 211, 212, 221 and 222, which as shown are connected in a cascode configuration, form an output stage of the word line driver circuit 200.

More particularly, transistor 211 is configured having a source coupled to VPP, a gate connected to a first node 213 and operative to receive a first signal, which may be a pull-up (PU) control signal, and a drain connected to a source of transistor 212 at a second node 241. Transistor 212 further includes a gate connected to a third node 203 and operative to receive a second signal, which may be a pull-up (PU) clamp gate bias signal, and a drain coupled to corresponding word line 150. Transistor 221 is configured having a source coupled to VWL, a gate connected to a fourth node 223 and operative to receive a third signal, which may be a pull-down (PD) control signal, and a drain connected to a source of transistor 222. Transistor 222 further includes a gate connected to a fifth node 204 and operative to receive a fourth signal, which may be a pull-down (PD) clamp gate bias signal, and a drain connected to the corresponding word line 150.

Word line driver circuit 200 preferably includes a first voltage level shifter 231, which may be a VPP level shifter, and a second voltage level shifter 232, which may be a VWL level shifter. Voltage level shifter 231 is preferably coupled between VPP 210 and a third voltage supply 214, which may be VPPLS. Voltage level shifter 232 is coupled between a fourth voltage supply 226, which may be VWLLS, and VWL 220. Inputs of voltage level shifters 231 and 232 are preferably connected together and form an input 201 of the word line driver circuit 200 for receiving an input signal (Input) supplied thereto. An output of voltage level shifter 231 is connected to the gate of PMOS transistor 211. Voltage level shifter 231 is operative to generate the PU control signal supplied to transistor 211 as a function of the input signal supplied to the word line driver circuit 200. Likewise, an output of voltage level shifter 232 is connected to the gate of NMOS transistor 221. Voltage level shifter 232 is operative to generate the PD control signal supplied to transistor 221 as a function of the input signal supplied to the word line driver circuit 200. In terms of function, VPP level shifter 231 preferably converts the input signal applied to input node 201 having a first voltage swing (e.g., 0 to VDD) to a second voltage swing (e.g., VPP to GND), thereby limiting the gate-to-source voltage of PMOS transistor 211 to VPP. Similarly, VWL level shifter 232 preferably converts the input signal voltage on node 201 to a third voltage swing (e.g., VWL to VDD), thereby limiting the gate-to-source voltage of NMOS transistor 221 to VDD+VWL.

The word line driver circuit 200 is operative, as a function of the input signal supplied to the input 201 of the word line driver circuit, to effectively couple one of the voltages VPP or VWL to the corresponding word line 150 in order to turn on or turn off, respectively, the memory cells 100 connected along the word line.

By way of illustration only and without loss of generality, to better understand how voltages are distributed within the word line driver circuit 200, consider exemplary voltage levels for an embedded DRAM fabricated using, for example, a 45 nm silicon-on-insulator (SOI) IC fabrication technology. Four primary voltage supplies (i.e., power rails) are used for providing power to the circuit 200; namely, voltage supply VPP 210 (e.g., about 1.75 volts nominally), voltage supply VWL 220 (e.g., about −0.35 volt nominally), a fifth voltage supply, which may be ground or GND (e.g., about 0 volts nominally), and a sixth voltage supply, which may be VDD (e.g., about 1.1 volts nominally), are employed. In conventional DRAM circuits, the VDD and GND supplies are used to power logic circuits (not explicitly shown) comprising thin-oxide FETs.

Considering various component sub-circuits of a given memory circuit (in particular, the word line driver circuit and memory cells), the word line driver circuit may have the largest differential voltage applied thereto. For the illustrative word line driver circuit 200, the maximum voltage differential applied to the word line driver circuit will be equal to about VPP minus VWL; that is, about 2.1 volts for the exemplary voltages stated above (i.e., 1.75 volts minus −0.35 volts). Lower voltages are typically applied to the memory cells 100.

Specifically, with reference again to FIG. 1, for DRAM cell 100, where voltage supply 140 is coupled to GND (e.g., 0 volts), when storing a logic low (e.g., "0") data state, storage node 130 may be at GND (0 volts) and the word line may be, at most, VPP (e.g., 1.75 volts). Therefore, when storing a logic low state, the maximum voltage differential across the gate and source of the access transistor 110 within the memory cell 100 will be about 1.75 volts in this illustrative embodiment. Alternatively, when storing a logic high (e.g., "1") data state, storage node 130 may be at VDD (e.g., 1.1 volts) and the word line may be, at a minimum, VWL (e.g., −0.35 volts). Therefore, when storing a logic high state, the maximum voltage differential across the gate and source of the access transistor 110 within the memory cell 100 will be about 1.45 volts in this illustrative embodiment. In either case (i.e., storing a logic high or a logic low data state), the maximum voltages present across two terminals in the memory cell 100 will be less than the maximum voltages potentially present in the word line driver circuit 200.

As will become apparent given the description herein with reference to FIGS. 2 through 7, a voltage difference between the source and drain of transistor 211 is less than a voltage difference between the VPP supply 210 and the VWL supply 220, and a voltage difference between the source and drain of the pull-down transistor 221 is less than the voltage difference between the VPP supply 210 and the VWL supply 220. Furthermore, respective magnitudes of gate-to-source voltages ($V_{GS}$) and gate-to-drain voltages ($V_{GD}$), as well as source-to-drain voltages ($V_{SD}$), for transistors 211, 212, 221 and 222 are less than the voltage difference between the VPP supply 210 and the VWL supply 220.

As previously stated, by way of example only, voltage supply 210 is preferably set to the voltage VPP. According to the exemplary voltages presented above, VPP may be equal to, for example, 1.75 volts. Voltage supply 220 is preferably set to the voltage VWL. According to the exemplary voltages presented above, VWL may be equal to, for example, −0.35 volts. The pull-up clamp gate bias signal supplied to node 203 is preferably set to a first clamp voltage level, VPU. The pull-down clamp gate bias signal supplied to node 204 is preferably set to a second clamp voltage level, VPD. Out of the voltages VPP, VWL, VPU and VPD, VPP is the highest voltage level and VWL is the lowest voltage level.

By way of example only, VPU may be approximately 0 volts (GND), and VPD may be approximately 1.1 volts (VDD). Note, that VPD is set to a voltage level between VPU and VPP (e.g., between about 0 volts and about 1.75 volts in this illustrative embodiment). Thus, an exemplary set of voltages includes: VPP equal to about 1.75 V; VWL equal to about −0.35 V; VPU equal to about 0 V; and VPD equal to about 1.1 V. This exemplary set of voltages corresponds to case 1 presented in Table 1 below.

As shown in Table 1 below for case 1, the VPPLS voltage supply 214 used by VPP level shifter 231 may be set to about 0 volts (GND) and the VWLLS voltage supply 226 used by VWL level shifter 232 may be set to about 1.1 volts (VDD). Of course, it is to be understood that all voltages presented in Table 1 and described herein are merely illustrative, and that the invention is not limited to any specific voltage levels.

300, a gate of transistor 321 is connected to a second node N2, which may form a true output of the voltage level shifter, a drain of transistor 311 is connected to a third node N3, and a drain of transistor 331 is connected to a fourth node N4.

Voltage level shifter 300 further includes a pair of inverters operatively coupled to the first and second PMOS transistors 311 and 321. Specifically, a first inverter is comprised of a third PMOS transistor 312 and a first NMOS transistor 313, and a second inverter is comprised of a fourth PMOS transistor 322 and a second NMOS transistor 323. A source of transistor 312 is connected to the drain of transistor 311 at node N3, a drain of transistor 312 is connected to the drain of transistor 313 and gate of transistor 321 at node N2, a gate of transistor 312 is connected to a gate of transistor 313 and

TABLE 1

| Supplies/ Nodes | Case 1 Input = 0 V (Volts) | Case 1 Input = 1.1 V (Volts) | Case 2 Input = 0 V (Volts) | Case 2 Input = 1.1 V (Volts) | Case 3 Input = 0 V (Volts) | Case 3 Input = 1.1 V (Volts) |
|---|---|---|---|---|---|---|
| VPP | 1.75 | 1.75 | 1.75 | 1.75 | 1.75 | 1.75 |
| VWL | −0.35 | −0.35 | −0.35 | −0.35 | −0.35 | −0.35 |
| VPPLS | 0 (GND) | 0 (GND) | 0 (GND) | 0 (GND) | 0.2 | 0.2 |
| VWLLS | 1.1 (VDD) | 1.1 (VDD) | 1.1 (VDD) | 1.1 (VDD) | 1.1 | 1.1 |
| VPU | 0 (GND) | 0 (GND) | 0.7* | 0.7* | 0.7 | 0.7 |
| VPD | 1.1 (VDD) | 1.1 (VDD) | 0.7* | 0.7* | 0.7 | 0.7 |
| PU control | 1.75 (VPP) | 0 (GND) | 1.75 (VPP) | 0 (GND) | 1.75 (VPP) | 0.7 (VPPLS) |
| PD control | 1.1 (VDD) | −0.35 (VWL) | 1.1 (VDD) | −0.35 (VWL) | 0.7 (VWLLS) | −0.35 (VWL) |
| Node 241 | 0.2 (VPU + $V_{T212}$) | 1.75 (VPP) | 0.7 Approx. (VPU + $V_{T212}$) | 1.75 (VPP) | 0.9 (VPU + $V_{T212}$**) | 1.75 (VPP) |
| Node 242 | −0.35 (VWL) | 0.9 (VPD − $V_{T222}$) | −0.35 (VWL) | 0.7 Approx. (VPD − $V_{T222}$) | −0.35 (VWL) | 0.5 (VPD − $V_{T222}$**) |
| Word Line 150 | −0.35 (VWL) | 1.75 (VPP) | −0.35 (VWL) | 1.75 (VPP) | −0.35 (VWL) | 1.75 (VPP) |
| S to D 211 | 1.55 | 0 | 0.85 | 0 | 0.85 | 0 |
| S to D 212 | 0.55 | 0 V | 1.25 | 0 | 1.25 | 0 |
| S to D 221 | 0 | 1.15 | 0 | 0.85 | 0 | 0.85 |
| S to D 222 | 0 | 0.85 | 0 | 1.25 | 0 | 1.25 |
| G to S 211 | 0 | 1.75 | 0 | 1.75 | 0 | 1.05 |
| G to D 211 | 1.55 | 1.75 | 0.85 | 1.75 | 0.85 | 1.05 |
| G to S 212 | 0.2 | 1.75 | 0.2 | 1.05 | 0.2 | 1.05 |
| G to D 212 | −0.35 | 1.75 | 1.05 | 1.05 | 1.05 | 1.05 |
| G to S 221 | 1.45 | 0 | 1.45 | 0 | 1.05 | 0 |
| G to D 221 | 1.45 | 1.25 | 1.45 | 0.85 | 1.05 | 0.85 |
| G to S 222 | 1.45 | 0.2 | 1.05 | 1.2 | 1.05 | 0.2 |
| G to D 222 | 1.45 | 0.65 | 1.05 | 1.05 | 1.05 | 1.05 |

*A voltage between 0 volts (GND) and 1.1 volts (VDD) and/or equal to one-half VPP plus one-half VWL.
**$V_{T212}$ is the absolute value of the threshold voltage for pull-up clamp transistor 212 having an exemplary value of about 0.2 volt. $V_{T222}$ is the absolute value of the threshold voltage for pull-up clamp transistor 222 having an exemplary value of about 0.2 volt.

Figure 3:
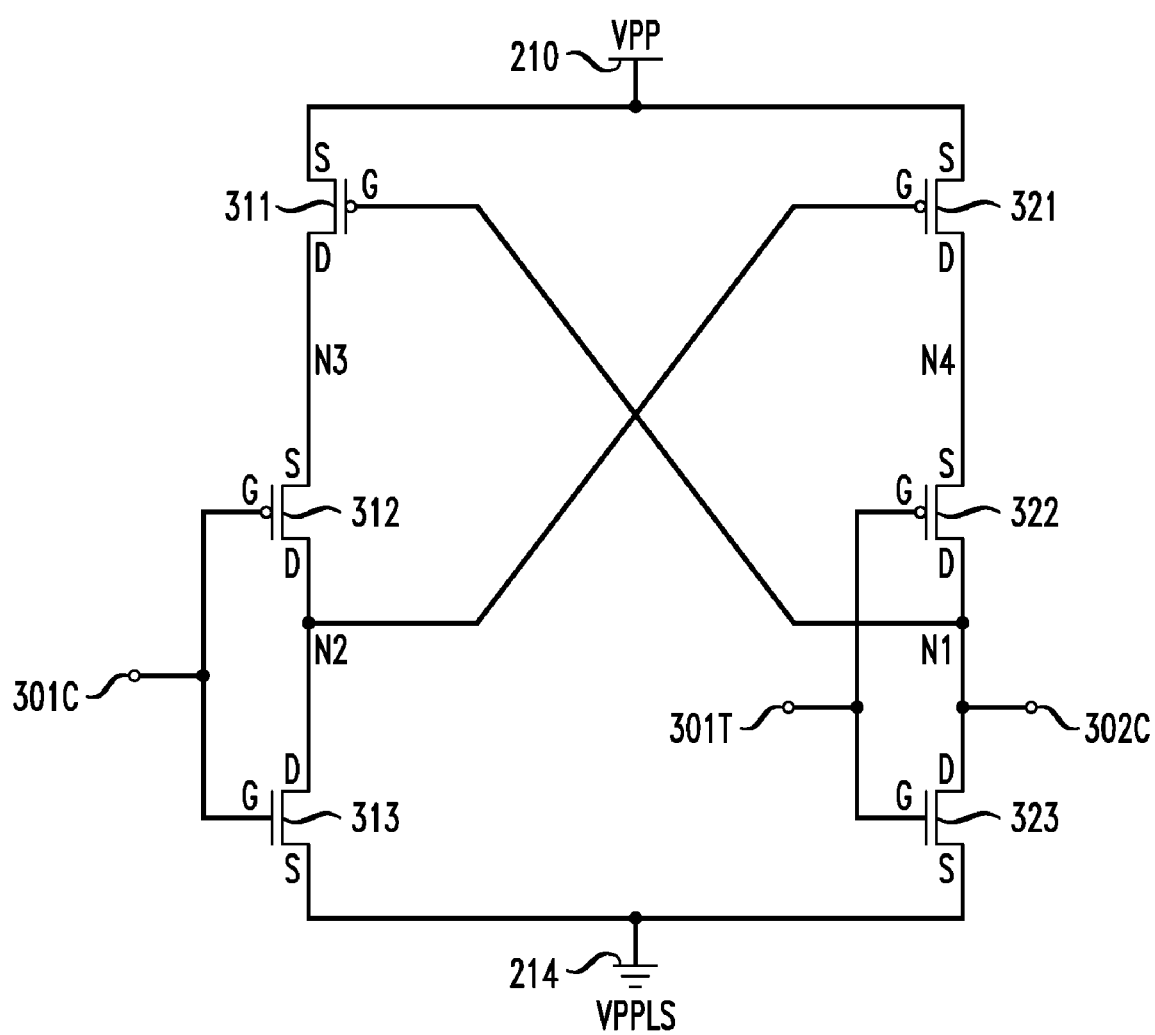
FIG. 3 is a schematic diagram depicting at least a portion of a first exemplary voltage level shifter which may be employed in the illustrative word line driver circuit shown in FIG. 2, according to an embodiment of the present invention.

FIG. 3 is a schematic diagram depicting at least a portion of a first exemplary voltage level shifter 300, which may be used to implement VPP level shifter 231 in the illustrative word line driver circuit 200 shown in FIG. 2, according to an embodiment of the invention. Voltage level shifter 300 includes a first PMOS transistor 311 and a second PMOS transistor 321 connected in a cross-coupled configuration. More particularly, sources of transistors 311 and 321 are coupled to a first voltage supply 210, which may be the VPP supply, a gate of transistor 311 is connected to a first node N1, which forms an output node 302C of the voltage level shifter forms a complement input node 301C for receiving a complement input signal supplied to the voltage level shifter 300, and a source of transistor 313 is coupled to a second voltage supply 214, which may be the VPPLS supply (see FIG. 2). A source of transistor 322 is connected to the drain of transistor 321 at node N4, a drain of transistor 322 is connected to a drain of transistor 323 at node N1, a gate of transistor 322 is connected to a gate of transistor 323 and forms a true input node 301T for receiving a true input signal supplied to the voltage level shifter 300, and a source of transistor 323 is coupled to voltage supply 214.

The voltage level shifter 300 receives true and complement input signals at the true input node 301T and complement input node 301C, respectively. The voltage level shifter 300 is operative to generate an output signal at the output node 302C which is of the same phase as the complement input signal supplied to input node 301C and of opposite phase to the true input signal supplied to input node 301T. Thus, the illustrative voltage level shifter 300 is an inverting level shifter. The invention, however, is not limited to an inverting voltage level shifter. For example, reassignment of the inputs, such that input node 301T is adapted to receive the complement input signal and input node 301C is adapted to receive the true input signal, would result in the output signal generated at output node 302C being of the same phase as the true input signal, and would therefore be considered to be non-inverting.

The true and complement input signals supplied to input nodes 301T and 301C, respectively, are preferably logic level signals that may be referenced to different voltage supplies than supplies 210 and 214 (e.g., GND to VDD voltage levels). Output node 302C will generate an output signal therefrom which is referenced to voltage supplies 210 and 214, and will therefore have a different (e.g., larger or shifted) range of voltage levels than the input signals supplied to input nodes 301T and 301C of the voltage level shifter 300. In the embodiment shown, the voltage levels of the output signal at node 302C will preferably vary between VPPLS (e.g., 0V) and VPP as a function of the logic state of the input signals. When used in the word line driver circuit 200, output node 302C of the voltage level shifter 300 is coupled to the gate of transistor 211 at node 213, and therefore the output signal generated by the voltage level shifter 300 at node 302C serves as the pull-up control signal in the word line driver circuit.

In terms of operation, when the input signal applied to input node 301C is a logic high level referenced to VDD (e.g., about 1.1 volts), the input signal applied to input 301T, being a complement of the signal applied to node 301C, will be a logic low level, which may be ground (e.g., 0 volts). Input 301C being high will significantly reduce the conductivity of transistor 312 (subsequently 312 turns off) and turn on transistor 313, thereby pulling node N2 to the voltage level of supply 214, namely, VPPLS (e.g., about 0 volts). Node N2 being low will turn on transistor 321, thereby pulling up node N4 to about the voltage level of supply 210, namely, VPP (e.g., about 1.75 volts). Similarly, input node 301T being low will turn off transistor 323 and turn on transistor 322, thereby pulling node N1 high (e.g., 1.75 volts) and turning off transistor 311. Thus, the output signal generated at output node 302C will be a logic high level referenced to the VPP supply 210 (e.g., about 1.75 volts) rather than to VDD.

Alternatively, when the input signal applied to input node 301C is a logic low level (e.g., about 0 volts), the input signal applied to input 301T, being a complement of the signal applied to node 301C, will be a logic high level referenced to VDD (e.g., about 1.1 volts). Input node 301T being high will turn on transistor 323 and significantly reduce the conductivity of transistor 322 (subsequently 322 turns off), thereby pulling node N1 low (e.g., 0 volts). Node N1 being low will turn on transistor 311, thereby pulling node N3 to the level of the voltage supply 210 (e.g., about 1.75 volts). Similarly, input 301C being low will turn on transistor 312 and turn off transistor 313, thereby pulling node N2 to a high level (e.g., 1.75 volts) and turning off transistor 321. Thus, the output signal generated at output node 302C will be a logic low level referenced to the VPPLS supply 210 (e.g., about 0 volts).

Figure 4:
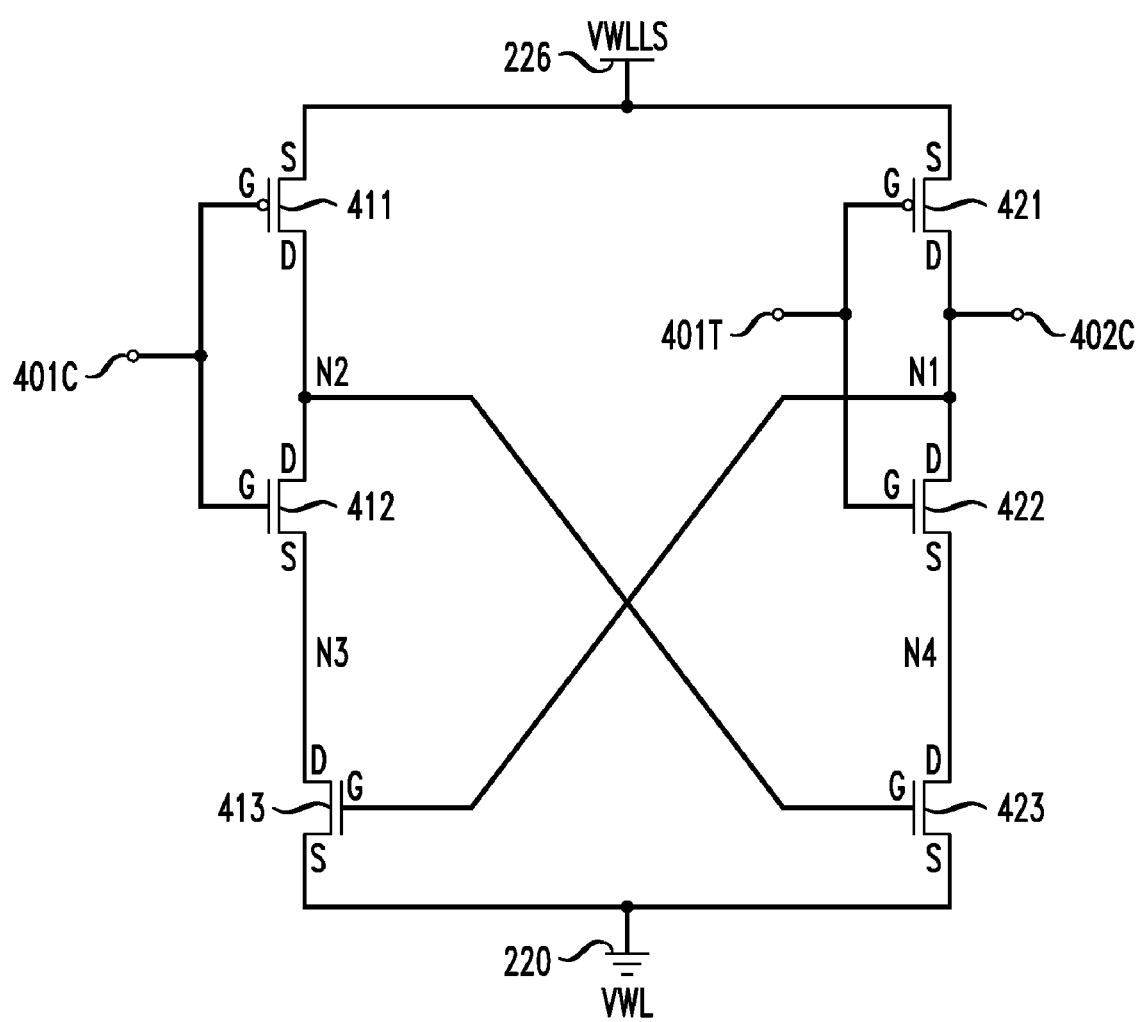
FIG. 4 is a schematic diagram depicting at least a portion of a second exemplary voltage level shifter which may be employed in the illustrative word line driver circuit shown in FIG. 2, according to an embodiment of the present invention.

FIG. 4 is a schematic diagram depicting at least a portion of a second exemplary voltage level shifter 400, which may be used to implement VWL level shifter 232 in the illustrative word line driver circuit 200 shown in FIG. 2, according to an embodiment of the invention. Voltage level shifter 400 is similar to level shifter 300 shown in FIG. 3, except that a pair of cross-coupled NMOS transistors is used rather than a pair of PMOS transistors. Specifically, voltage level shifter 400 includes a first NMOS transistor 413 and a second NMOS transistor 423 connected in a cross-coupled configuration. Sources of transistors 413 and 423 are coupled to a first voltage supply 220, which may be the VWL supply (FIG. 2), a gate of transistor 413 is connected to a first node N1, which forms an output node 402C of the voltage level shifter 400, a gate of transistor 423 is connected to a second node N2, which may form a true output of the voltage level shifter, a drain of transistor 413 is connected to a third node N3, and a drain of transistor 423 is connected to a fourth node N4.

Voltage level shifter 400 further includes a pair of inverters operatively coupled to the first and second NMOS transistors 413 and 423. Specifically, a first inverter is comprised of a third NMOS transistor 412 and a first PMOS transistor 411, and a second inverter is comprised of a fourth NMOS transistor 422 and a second PMOS transistor 421. A source of transistor 412 is connected to the drain of transistor 413 at node N3, a drain of transistor 412 is connected to the drain of transistor 411 and gate of transistor 423 at node N2, a gate of transistor 412 is connected to a gate of transistor 411 and forms a complement input node 401C for receiving a complement input signal supplied to the voltage level shifter 400, and a source of transistor 411 is coupled to a second voltage supply 226, which may be the VWLLS supply (FIG. 2). A source of transistor 422 is connected to the drain of transistor 423 at node N4, a drain of transistor 422 is connected to a drain of transistor 421 at node N1, a gate of transistor 422 is connected to a gate of transistor 421 and forms a true input node 401T for receiving a true input signal supplied to the voltage level shifter 400, and a source of transistor 421 is coupled to voltage supply 226.

The voltage level shifter 400 receives true and complement input signals at the true input node 401T and complement input node 401C, respectively. The voltage level shifter 400 is operative to generate an output signal at the output node 402C which is of the same phase as the complement input signal supplied to input node 401C and of opposite phase to the true input signal supplied to input node 401T. Thus, the illustrative voltage level shifter 400 is an inverting level shifter. The invention, however, is not limited to an inverting voltage level shifter. For example, reassignment of the inputs, such that input node 401T is adapted to receive the complement input signal and input node 401C is adapted to receive the true input signal, would result in the output signal generated at output node 402C being of the same phase as the true input signal, and would therefore be considered to be non-inverting.

The true and complement input signals supplied to input nodes 401T and 401C, respectively, are preferably logic level signals that may be referenced to different voltage supplies than supplies 226 and 220 (e.g., GND to VDD voltage levels). Output node 402C will generate an output signal therefrom which is referenced to voltage supplies 226 and 220, and will therefore have a different (e.g., larger or shifted) range of voltage levels than the input signals supplied to input nodes 401T and 401C of the voltage level shifter 400. In the embodiment shown, the voltage levels of the output signal at node 402C will preferably vary between VWLLS (e.g., about 1.1 volts) and VWL (e.g., about −0.35 volts) as a function of the logic state of the input signals. When used in the word line driver circuit 200, output node 402C of the voltage level shifter 400 is coupled to the gate of transistor 221 at node 223, and therefore the output signal generated by the voltage level shifter 400 at node 402C serves as the pull-down control signal in the word line driver circuit.

In terms of operation, when the input signal applied to input node 401C is a logic high level referenced to VDD (e.g., about 1.1 volts), the input signal applied to input 401T, being a complement of the signal applied to node 401C, will be a logic low level, which may be ground (e.g., 0 volts). Input 401T being low will significantly reduce the conductivity of transistor 422 (subsequently 422 turns off) and turn on transistor 421, thereby pulling up node N1 to the voltage level of supply 226, namely, VWLLS (e.g., about 1.1 volts). Node N1 being high will turn on transistor 413, thereby pulling down node N3 to about the voltage level of supply 220, namely, VWL (e.g., about −0.35 volts). Similarly, input 401C being high will turn off transistor 411 (assuming the voltage difference between the gate and source of transistor 411 is less than a threshold voltage of transistor 411) and will turn on transistor 412, thereby pulling node N2 low and turning off transistor 423. Thus, the output signal generated at output node 402C will be a logic high level referenced to voltage supply 226 (e.g., about 1.1 volts).

Alternatively, when the input signal applied to input node 401C is a logic low level (e.g., 0 volts), the input signal applied to input 401T, being a complement of the signal applied to node 401C, will be a logic high level referenced to VDD (e.g., about 1.1 volts). Input node 401C being a logic low level will significantly reduce the conductivity of transistor 412 (subsequently 412 turns off) and turn on transistor 411, thereby pulling up node N2 to the voltage level of supply 226 (e.g., about 1.1 volts). Node N2 being high will turn on transistor 423, thereby pulling node N4 to the voltage level of supply 220 (e.g., about −0.35 volts). Similarly, input node 401T being high will turn off transistor 421 and turn on transistor 422, thereby pulling node N1 low. Thus, the output signal generated at output node 402C will be a logic low level referenced to voltage supply 220 (e.g., about −0.35 volts) rather than ground.

With continued reference to FIG. 2, input 201, although depicted as a single connection, may comprise both true and compliment input signals and may therefore be considered a 2-wire bus. The true input connection of input 201 is coupled to the true input (e.g., input node 301T of FIG. 3) of the VPP level shifter 231 and to the true input (e.g., input node 401T of FIG. 4) of the VWL level shifter 232. Likewise, the compliment input connection of input 201 is coupled to the compliment input (e.g., input node 301C of FIG. 3) of the VPP level shifter 231 and to the compliment input (e.g., input node 401C of FIG. 4) of the VWL level shifter 232. Thus, the VPP level shifter 231 and the VWL level shifter 232 receive the same input signals.

The word line 150 is driven to the voltages of either approximately VPP or approximately VWL depending on the logic state of the input signal supplied to input 201 of the word line driver circuit 200. The word line 150 is driven to about VPP (e.g., about 1.75 volts) when the true input signal of input 201 transitions to a high logic level and is driven to about VWL (e.g., about −0.35 volts) when the true input signal supplied to input 201 transitions to a low level.

Figure 5:
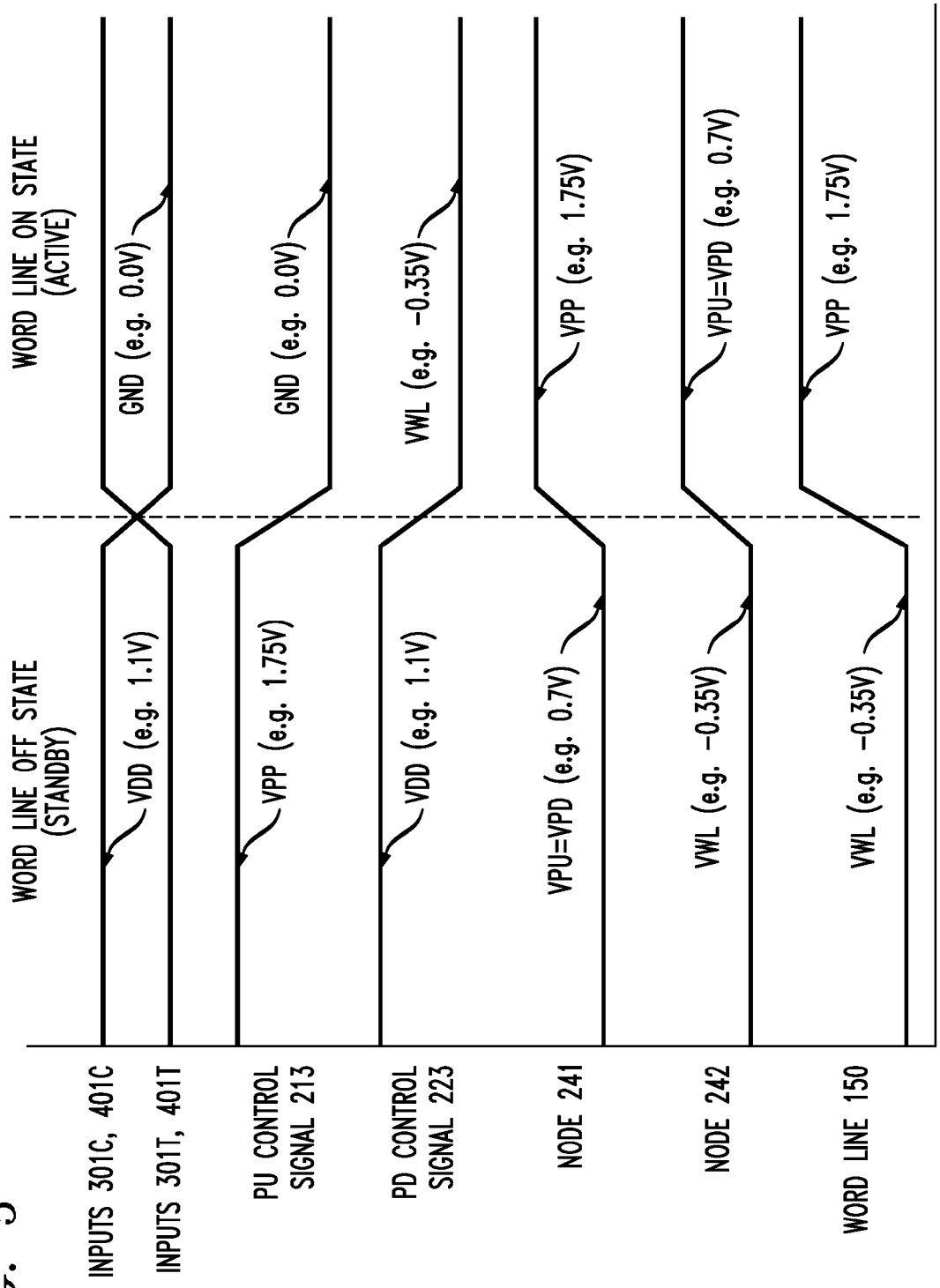
FIG. 5 is a graphical illustration depicting exemplary waveforms representing voltages of various signals and nodes associated with an operation of the word line driver circuit shown in FIG. 2, according to an embodiment of the present invention.

FIG. 5 is a graphical illustration depicting exemplary waveforms representing voltages of various signals and nodes associated with an operation of the word line driver circuit 200 shown in FIG. 2, according to an embodiment of the invention. Voltage levels, and the respective transitions between the voltage levels, are shown for two states of the word line driver circuit 200; namely, an off state and an on state. The on state (or active state) corresponds to the word line 150 being driven to a high voltage level (e.g., VPP); for example, when the word line 150 turns on the access transistor 110 (see FIG. 1) in each of the memory cells 100 coupled to the word line 150. An off state (or standby state) corresponds to the word line 150 being driven to a low voltage level (e.g., VWL); for example, when the word line 150 turns off the access transistor 110 in each of the memory cells 100 coupled to the word line 150.

It is to be understood that the voltages shown in FIG. 5 are illustrative only, and that the invention is not limited to any particular voltages. In this illustrative embodiment, VWL is equal to about −0.35 volts; GND is equal to about 0 volts; VDD is equal to about 1.1 volts; and VPP is equal to about 1.75 volts. For the illustrated waveforms, the voltage VPU is equal to the voltage VPD, which preferably equals about one-half of the VPP supply voltage (e.g., about 0.875 volt) plus one-half of the VWL supply voltage (e.g., about −0.175 volt), or about 0.7 V; the voltage level of the VPPLS power supply 214 is GND (e.g., 0 volts); and the voltage level of the VWLLS power supply is VDD (e.g., about 1.1 volts). These exemplary voltages correspond to case 2 presented in Table 1.

As apparent from FIG. 5, both the true inputs 301T and 401T (see FIGS. 3 and 4), which are indicative of the true input signals presented to voltage level shifters 300 and 400, respectively, are high (e.g., VDD) in the active state and low (e.g., GND) in the standby state of the word line driver circuit. Likewise, both the complement inputs 301C and 401C, which are indicative of the complement input signals presented to the voltage level shifters 300 and 400, respectively, are low in the active state and high in the standby state of the word line driver circuit 200. Furthermore, the corresponding voltage levels of word line 150 (trace 7 in FIG. 5) are approximately VPP (e.g., 1.75 volts) in the active state and approximately VWL (e.g., −0.35 volts) in the standby state of the word line drive circuit 200.

The pull-up control signal 213 (trace 3 in FIG. 5) preferably ranges from GND in the active state of the word line driver circuit to VPP in the standby state of the word line driver circuit. The pull-down control signal 223 (trace 4 in FIG. 5) preferably ranges from VWL in the active state of the word line driver circuit to VDD in the standby state of the word line driver circuit. Node 241 (trace 5 in FIG. 5) preferably ranges from VPP in the active state of the word line driver circuit to VPU (equal to VPD) in the standby state of the word line driver circuit. Node 242 (trace 6 in FIG. 5) preferably ranges from VPD (equal to VPU) in the active state of the word line driver circuit to VWL in the standby state of the word line driver circuit.

Referring again to FIG. 2, when the word line 150 is being driven or held low (e.g. to VWL=−0.35 volts), the voltage drop across the series cascade arrangement of the pull-up transistor 211 and the pull-up clamp transistor 212 will be VPP minus VWL, or about 2.1 volts. Without clamp transistor 212, this voltage may be high enough to damage pull-up transistor 211. However, transistor 212 functions, at least in part, to clamp the voltage appearing at node 241 to VPU=VPD=e.g. 0.7V (near a transistor threshold voltage above the pull-up clamp gate bias signal applied to the gate of transistor 212 at node 203). Thus, by dropping voltage across the source-to-drain of transistor 212, transistor 212 beneficially reduces the source-to-drain voltage present across transistor 211 (to VPP−VPU=e.g., 1.05 volts) when transistor 211 is biased in the off state (i.e., non-conductive). When the word line 150 is held at VWL, transistor 211 and transistor 212 are biased in the off (non-conductive) state, and the DRAM cell 100 is in the standby mode; that is, DRAM cell 100 is not being accessed (i.e., read, written or refreshed). When the word line 150 is held at VWL, the pull-down transistor 221 and the pull-down clamp transistor 222, which are connected in a cascade configuration, are both biased in the on (conductive) state.

Alternatively, when the word line 150 is driven or held high (e.g. to about VPP=1.75 volts), the voltage drop across the series cascade arrangement of the pull-down transistor 221 and the pull-down clamp transistor 222 will be VPP minus VWL, or about 2.1 volts. Without clamp transistor 222 present, this voltage may be high enough to damage pull-down transistor 221. However, transistor 222 functions, at least in part, to clamp the voltage appearing at node 242 to about a transistor threshold voltage below the pull-down clamp gate bias signal applied to the gate of transistor 222 at node 204. Thus, by dropping voltage across the source-to-drain of transistor 222, transistor 222 beneficially reduces the source-to-drain voltage present across transistor 221 when transistor 221 is biased in the off state (i.e., non-conductive). When the word line 150 is held at VWL, transistor 221 and transistor 222 are biased in the off (non-conductive) state, and the DRAM cell 100 is in the active mode; that is, DRAM cell 100 is being accessed (i.e., read, written or refreshed). When the word line 150 is held at VPP, the pull-up transistor 211 and the pull-up clamp transistor 212 are both biased in the on (conductive) state.

In addition to maintaining the magnitudes of the source-to-drain voltage for the pull-up transistor 211 and for the pull-down transistor 221 below (e.g., ideally to half of) VPP minus VWL, the respective magnitudes of the source-to-drain voltages of the pull-up clamp transistor 212 and the pull-down clamp transistor 221 are also maintained below (e.g., ideally to half of) VPP minus VWL. Furthermore, the respective magnitudes of the gate-to-source and gate-to-drain voltages of transistors 211, 212, 221 and 222 are maintained below VPP minus VWL. Additionally, by inspection or analysis of the VPP level shifter 231 and the VWL level shifter 232, which may be implemented by exemplary voltage level shifters 300 and 400, respectively (see FIGS. 3 and 4), it can be easily demonstrated that all transistors in these level shifters (e.g., transistors 311, 312, 313, 321, 322, 323, 411, 412, 413, 421, 422 and 423 in FIGS. 3 and 4) have gate-to-source, gate-to-drain, and source-to-drain voltages that are maintained below the voltage level of about VPP minus VWL.

Table 1 illustrates exemplary voltages applied to the word line driver circuit 200 according to cases 1, 2 and 3. The applied voltages are for voltage supplies VPP, VWL, VPPLS, VWLLS, the pull-up clamp gate bias signal (VPU), and for the pull-down clamp gate bias signal (VPD). The application of these voltages in cases 1 and 2 has been previously described. Table 1 further lists exemplary voltages for the pull-up control signal (PU control), the pull-down control signal (PD control), node 241, node 242, and the word line 150 driven by the word line driver circuit 200 depicted in FIG. 2. Knowing these voltages, the respective magnitudes of the source-to-drain, gate-to-drain and gate-to-source voltage differences for each transistor 211, 212, 221 and 222 can be easily determined. These magnitudes of voltage differences are listed in Table 1 above (e.g., S to D 211 being indicative of the magnitude of the voltage difference between the source and drain of transistor 211). $V_{T212}$ is the absolute value of the threshold voltage for pull-up clamp transistor 212. $V_{T222}$ is the absolute value of the threshold voltage for pull-down clamp transistor 222. By way of example only, $V_{T212}$ and $V_{T212}$ are chosen to be about 0.2 volt. For each case, voltages are listed corresponding to two different logic levels applied to the input 201 of the word line driver circuit 200. The two different logic levels are 0 V (GND) and 1.1 V (VDD).

As apparent from Table 1, a voltage on the drain of the pull-up transistor 211 (node 241) has a lower limit of VPU plus $V_{T212}$, which is defined by the pull-up clamp transistor 212 to, and a voltage on the drain of the pull-down transistor 212 (node 242) has an upper limit of about VPD minus $V_{T212}$ defined by the pull-down clamp transistor 222, as previously explained.

Regarding case 3, setting VPPLS, VWLLS, VPU and VPD to a common 0.7 V voltage level ensures that a magnitude (i.e., absolute value) of the gate-to-drain and gate-to-source voltages for each of the transistors 211, 212, 221 and 222 does not exceed about one-half of VPP minus one-half of VWL (e.g., VPP/2−VWL/2), which is about 1.05 volts in this illustrative embodiment, either when the word line 150 is driven to or maintained at high (e.g., VPP) or low (e.g., VWL) voltage levels. Note, that the gate-to-source and gate-to-drain voltages for each of the transistors 211, 212, 221 and 222 will preferably not exceed VDD (e.g., about 1.1 volts), and thus will not exceed prescribed gate-to-source or gate-to-drain voltage limits for a thin-oxide (i.e., logic) transistor.

For case 3, with two exceptions, the magnitude of the source-to-drain voltage difference for transistors 211, 212, 221 and 222 does not exceed VDD and is at most one-half of VPP minus one-half of WWL (VPP/2−VWL/2). The two exceptions are the magnitude of the source-to-drain voltage difference of the pull-up clamp transistor 212 and the magnitude of the source-to-drain voltage difference of the pull-down clamp transistor 222, both having a maximum magnitude of source-to-drain voltage difference of about 1.25 volts. This source-to-drain voltage difference, however, can be supported or accommodated by an appropriately sized channel length for transistors 212 and 222 (e.g., increasing the channel length by about ten percent), as will be understood by those skilled in the art given the teachings herein.

The appropriate channel length may be, for example, somewhat longer than the minimum necessary to support or accommodate VDD (e.g., 1.1 V); for example, from about ten percent to about twenty percent longer compared to a transistor supporting less than its prescribed maximum voltage across any two of its terminals. Such a longer channel length device is in the range of conventional logic fabrication technologies and does not require any special processing steps. Therefore, thin-oxide transistors may be used for transistors 211, 212, 221 and 222. Transistors 211 and 221 may be thin-oxide transistors designed to support VDD voltage levels (e.g., having minimum channel lengths as specified by the logic fabrication technology for thin-oxide transistors designed to support VDD). Transistors 212 and 222 may be conventional thin-oxide transistors having channel lengths sufficiently long to support a higher source-to-drain voltage of the transistors 212 and 222, for example, to support about 1.25 volts.

Supporting or accommodating a voltage across any two of the source, drain and gate terminals is intended to accommodate a voltage across such terminals without undue damage and/or degradation of the transistor; for example, without damage or degradation greater than that expected when operating the transistor within the prescribed specifications of the particular IC fabrication technology employed.

More particularly, with reference to FIG. 2, VPP level shifter 231 is preferably designed to accommodate the VPPLS voltage supply; for example, transistors within the VPP level shifter 231 are preferably designed, sized or have gains appropriate for proper functioning of the VPP level shifter. By way of example only, transistors 313 and 323 in level shifter 300 (see FIG. 3) are preferably designed to have adequate gain or transconductance so as to assist in switching the level shifter from one logic state to the other. Specifically, transistors 313 and 323 may have thresholds lower than one or more of transistors 311, 312, 321 and 322 (e.g., about 250 mV lower). Similar considerations apply to the VWL level shifter 232 with respect to the VWLLS voltage supply.

The word line driver circuit 200 may be operated under bias conditions other than the exemplary cases illustrated in Table 1 above, as will become apparent to those skilled in the art given the teachings herein. By way of example only, the word line driver circuit 200 may be biased according to the following illustrative voltages: VPP=1.75 V; VWL=−0.35; VPPLS=VPU=VPD=$V_{ref}$ (e.g., $V_{ref}$=0.3 V); and VWLLS=1.1 V. Under these conditions, the maximum voltage across the VPP level shifter 231 will be less than VPP (e.g., VPP−0.3 V, or about 1.45 V). Note, that if $V_{ref}$ equals 0.7 V, the biases are defined according to case 3 in Table 1 above.

There are typically a plurality of word line driver circuits 200 within a given memory circuit, one word line driver circuit coupled to a corresponding word line 150. At most, two VPP level shifters 231, out of the plurality of VPP level shifters 231 comprised in the collective plurality of word line drivers 200, will switch at any given time. Internally, within the voltage level shifter 300 shown in FIG. 3 (which may be used to implement VPP level shifter 231), transistors 312, 313, 322 and 323 each drive a single gate load. Transistors 312, 313, 322 and 323 additionally drive a single external gate load (e.g., pull-up transistor 211). Thus, the requirements on the transient current capacity of the VPPLS voltage supply will be relatively small, especially considering the relatively large decoupling capacitance typically attributable to the circuit topology of the multiple word line driver circuits 200 that are not switching. Moreover, standby current flowing between VPP and VPPLS through the plurality of VPP level shifters 231 is reduced super-linearly and VPP minus VPPLS is decreased as VPPLS is increased above GND (0 V). Similar considerations apply to the VWL level shifter 226 with respect to the VWLLS voltage supply.

Figure 6:
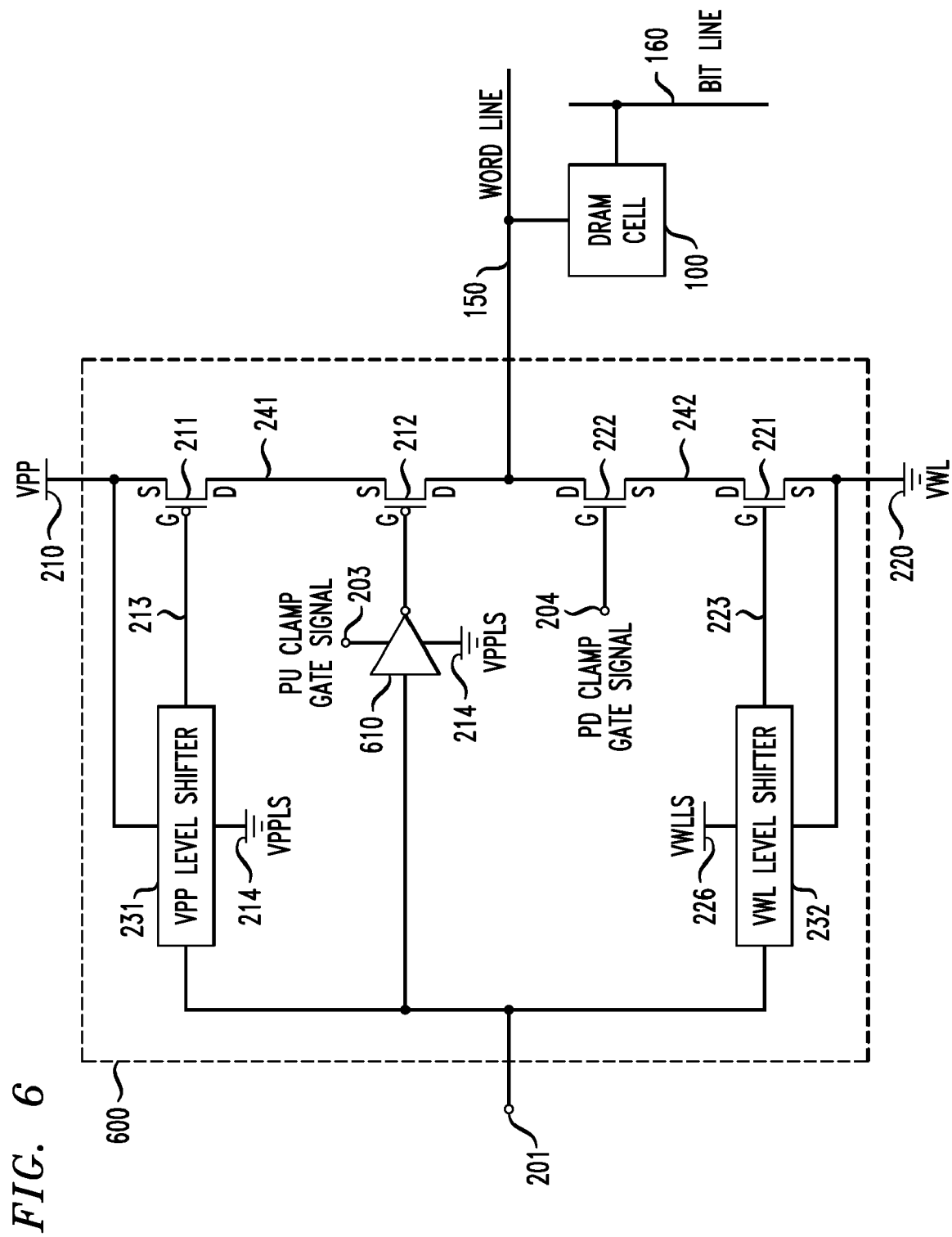
FIG. 6 is a schematic diagram depicting at least a portion of an exemplary word line driver circuit including a switchable gate voltage applied to a pull-up clamp transistor, according to an embodiment of the present invention.

FIG. 6 is a schematic diagram depicting at least a portion of an exemplary word line driver circuit 600, according to another embodiment of the invention. The word line driver circuit 600, like the illustrative word line driver circuit 200 shown in FIG. 2, includes a pair of PMOS transistors and a pair of NMOS transistors connected together in a series cascade configuration. Specifically, word line driver circuit 600 comprises a PMOS pull-up transistor 211, a PMOS pull-up clamp transistor 212, an NMOS pull-down transistor 221 and an NMOS pull-down clamp transistor 222. A source of transistor 211 is coupled to a first voltage supply 210 supplying a first voltage, which may be VPP; a drain of transistor 211 is connected to a source of transistor 212 at node 241; a gate of transistor 211 is coupled to a first voltage level shifter, which may be VPP level shifter 231, at node 213 and is adapted to receive a first control signal generated by the VPP level shifter; a drain of transistor 212 is connected to a drain of transistor 222 and forms an output of the word line driver circuit 600 which is coupled to a corresponding word line 150; a gate of transistor 212 is adapted to receive a first bias signal, which is preferably switched between PU and VPPLS; a source of transistor 222 is connected to a drain of transistor 221 at node 242; a gate of transistor 222 is adapted to receive a second bias signal at node 204; a source of transistor 221 is coupled to a second voltage supply 220 supplying a second voltage, which may be VWL; and a gate of transistor 221 is coupled to a second voltage level shifter, which may be VWL level shifter 232, at node 223 and is adapted to receive a second control signal generated by the VWL level shifter.

VPP level shifter 231 is preferably coupled between, and is power by, the VPP supply 210 and a third voltage supply 214, which may be VPPLS. VWL level shifter 232 is coupled between, and is powered by, a fourth voltage supply 226, which may be VWLLS, and the VWL supply 220. Illustrative voltage levels for each of these voltage supplies were described above in connection with FIG. 2, although it is to be appreciated that the invention is not limited to any specific voltage levels. Inputs of the VPP and VWL level shifters 231 and 232, respectively, are preferably connected together an forms an input 201 of the word line driver circuit 600 for receiving an input signal supplied thereto. An output of VPP level shifter 231 is connected to the gate of pull-up transistor 211 and an output of the VWL level shifter 232 is connected to the gate of pull-down transistor 221, as previously stated. The VPP level shifter 231 is operative to generate, at an output thereof, the first (pull-up) control signal supplied to transistor 211 as a function of the input signal supplied to the input 201 of the word line driver circuit 600. Likewise, the VWL level shifter 232 is operative to generate the second (pull-down) control signal supplied to transistor 221 as a function of the input signal supplied to the word line driver circuit 600.

Word line driver circuit 600 additionally comprises a switching circuit 610, which in this exemplary embodiment is shown as an inverter, having an input coupled to the input 201 of the word line driver circuit and having an output coupled to the gate of the pull-up clamp transistor 212. The switching circuit 610 preferably receives a pull-up clamp gate bias signal (e.g., VPU). The pull-up clamp gate bias signal is preferably coupled to a first (higher) voltage supply node 203 of switching circuit 610, and a second (lower) voltage supply terminal of the switching circuit is preferably coupled to a fourth voltage supply, which may be VPPLS power supply 214.

Switching circuit 610 is operative to generate an output signal which switches between the voltages VPU and VPPLS as a function of the input signal supplied to the input 201 of the word line driver circuit 600. When the input 201 is low (e.g., about GND=0 volts), the output of the switching circuit 610 will preferably be about equal to the higher voltage supply, namely, VPU, and the word line 150 is, or will be driven to, about VWL (e.g., about −0.35 volts). Alternatively, when the input 201 is high (e.g., about VDD=1.1 volts), the output of the switching circuit 610 will be about equal to the lower voltage supply, namely, VPPLS, and the word line 150 is, or will be driven to, about VPP (e.g., about 1.75 volts). Note, that exemplary values, as set forth in Table 1 and elsewhere above, for VPPLS include 0 V, and for VPU include 0.3 V and 0.7 V. VPU preferably has an upper limit of about VPP.

The word line driver circuit 600 may have a faster rise time compared to word line driver circuit 200 depicted in FIG. 2, for example, when operated according to case 2 in Table 1. More particularly, when the word line 150 is pulled up to VPP, the switching circuit 610 drives the gate voltage of the pull-up clamp transistor 212 from about VPU (e.g., 0.7 V) to about VPPLS (e.g., 0 V), thereby increasing a transconductance of transistor 212 when driving the word line high to about VPP. With a higher transconductance, the switching speed of the word line driver circuit 600 is advantageously increased accordingly compared to the switching speed of word line driver circuit 200 operated according to case 2.

FIG. 7A is a schematic diagram depicting at least a portion of an exemplary word line driver circuit 700, according to yet another embodiment of the invention. Like the exemplary word line driver circuits 200 and 600 depicted in FIGS. 2 and 6, respectively, word line driver circuit 700 comprises an output stage including a pair of PMOS transistors 211 and 212 and a pair of NMOS transistors 221 and 222 connected together in a series cascade arrangement. Word line driver circuit 700 also includes first and second voltage level circuits 231 and 232 which operate in a manner consistent with the VPP and VWL level shifters shown in FIGS. 2 and 6. However, rather than the voltage level shifters 231 and 232 supplying the pull-up and pull-down control signals directly to the gates of corresponding transistors 211 and 221, respectively, word line driver circuit 700 includes a pair of gate clamp transistors, each gate clamp transistor being coupled between a voltage level shifter and a corresponding pull-up or pull-down transistor.

Specifically, word line driver circuit 700 includes a PMOS pull-up gate clamp transistor 711 having a drain connected to an output of VPP level shifter 231, a source connected to the gate of pull-up transistor 211, and a gate connected to node 703 and operative to receive a pull-up/pull-down clamp gate signal supplied to node 703. Likewise, word line driver circuit 700 further includes an NMOS pull-down gate clamp transistor 721 having a drain connected to an output of VWL level shifter 232, a source connected to the gate of pull-down transistor 221, and a gate connected to node 703 and operative to receive the pull-up (PU)/pull-down (PD) clamp gate signal supplied to node 703.

The pull-up gate clamp transistor 711 selectively couples the output of the VPP level shifter 231 to the gate of the pull-up transistor 211 as a function of the PU/PD clamp gate signal supplied to node 703. Likewise, the pull-down gate clamp transistor 721 selectively couples the output of the VWL level shifter 232 to the gate of the pull-down transistor 221 as a function of the PU/PD clamp gate signal supplied to node 703. Note, rather than receiving separate pull-up and pull-down clamp gate signals for individually biasing the pull-up and pull-down clamp transistors 212 and 222, respectively, the gates of transistors 212 and 222 are also connected to node 703, and therefore transistors 212 and 222 are biased by the PU/PD clamp gate signal supplied to node 703.

The source of the pull-up gate clamp transistor 711 provides the pull-up control signal to the pull-up transistor 211 at node 213. When transistor 711 is biased in an active (i.e., conductive or on) state, for example, when the voltage on node 703 falls to at least a threshold voltage below the source of transistor 711 at node 213, the output signal generated by the VPP level shifter 231 will pass through transistor 711 to form the pull-up control signal provided to the gate of the pull-up transistor 211. More specifically, node 703 is coupled to the PU/PD clamp gate signal, VREF, (preferably a DC signal) so that node 213 will be clamped by transistor 711. Node 703 is also coupled to the gate of PMOS transistor 212, so that node 241 is clamped by transistor 212. This allows nodes 213 and 241 to swing between a minimum voltage of VREF+$V_{TP}$ and a maximum voltage of VPP, where $V_{TP}$ is the threshold voltage of PMOS devices 711 and 212, which protect PMOS transistor 211. When transistor 711 is biased in an inactive (i.e., non-conductive or off) state, for example, when the voltage on node 703 is less than about a threshold voltage below the source of transistor 711, node 213 will essentially be undefined (i.e., "floating" voltage essentially defined by sub-threshold leakage currents).

Transistor 711 may modify the output from the VPP level shifter 231 before providing the pull-up control signal to transistor 211. Consider, for example, case 2 of Table 1 above, when the input 201 of the word line driver circuit 700 equals about 1.1 volts. As apparent from Table 1, the magnitudes of the gate-to-source voltage (G to S 211) and the gate-to-drain voltage (G to D 211) of transistor 211 may be greater than VDD (e.g., about 1.1 volts). In order for a thin-oxide transistor to be employed for transistor 211, which reduces the rise time of the word line 150, these gate-to-source and gate-to-drain voltages should be reduced to a maximum of VDD.

In case 2, with the input 201 equal to about 1.1 volts, the output of the VPP level shifter 231 driving the drain of pull-up gate clamp transistor 711 will be about 0 volts (GND). Transistor 711 is operative to shift the 0 volts received at its drain to about a threshold voltage ($V_{T711}$) above the voltage supplied to the common gate node 703. By way of example only, node 703 is preferably set to a voltage of about 0.7 volt. A voltage of 0.7 volt for node 703 is consistent with pull-up clamp voltage level (VPU) and pull-down clamp voltage level (VPD), which are the voltages that nodes 203 and 204, respectively, are set to in case 2 (see FIG. 2). For case 2, with the input 201 equal to about 1.1 volts, node 703 equal to about 0.7 volt, and a threshold voltage for transistor 711 of about 0.2 volt, the gate voltage of the pull-up transistor 211 will be about 0.9 volt (i.e., about 0.7 V+0.2 V). Thus, the magnitude of the gate-to-source voltage and the magnitude of the gate-to-drain voltage for transistor 211 will be about 0.85 volt (i.e., about VPP−0.9 V), below the prescribed 1.1-volt limit for thin-oxide transistors.

Thus, the pull-up control signal supplied to node 213 is limited by the pull-up clamp transistor 711 to a higher level equal to approximately $V_{T711}$ above a voltage level applied to the gate of transistor 711 at node 703, and a voltage difference between the source and gate of transistor 211 is limited to approximately a difference between VPP and $V_{T711}$ above the voltage level applied to the gate of the pull-up gate clamp transistor 711. In this example, $V_{T711}$ is indicative of the threshold voltage of transistor 711.

During the time that the word line 150 is active (e.g., about the time that the input 201 equals about 1.1 volts), sub-threshold leakage current through pull-up gate clamp transistor 711 may reduce the voltage on node 213 below a threshold voltage above the common gate node 703 voltage (e.g., below 0.9 volt). However, in case 2, the decrease in voltage of node 213 would have to be greater than 0.25 volt for the source- or drain-to-gate voltage of transistor 211 to be above 1.1 volts. Particularly in a DRAM application, this is unlikely to occur given that the word line 150 is typically active for only a relatively short amount time (e.g., less than about 10 nanoseconds) while the memory cell 100 is being accessed, which is not enough time for the sub-threshold leakage current to lower the voltage on node 213 significantly by 0.25 volt. Sub-threshold leakage current through transistor 711 may be minimized by design of transistor 711, such as, for example, by sizing transistor 711 to have a longer channel length (e.g., about ten percent longer than a prescribed minimum channel length) and/or a higher threshold voltage sufficient to ensure that the sub-threshold leakage current is below a prescribed level.

In a similar manner, the source of the pull-down gate clamp transistor 721 provides the pull-down control signal to the pull-down transistor 221 at node 223. When transistor 721 is biased in an active (i.e., conductive or on) state, for example, when the voltage on node 703 rises to at least a threshold voltage above the source of transistor 721 at node 223, the output of the VWL level shifter 232 passes through transistor 721 to form the pull-down control signal provided to the gate of transistor 221. More specifically, node 703 is coupled to the PU/PD clamp gate signal, VREF, (preferably a DC signal) so that node 223 is clamped by NMOS transistor 721. Node 703 is also coupled the gate of NMOS transistor 222 so that node 242 is clamped by transistor 222. This allows nodes 213 and 241 to swing between a minimum voltage of VWL to maximum voltage of VREF−$V_{TN}$, where $V_{TN}$ is the threshold voltage of NMOS transistors 721 and 222, which protect NMOS transistor 221. When transistor 721 is biased in an inactive (i.e., non-conductive or off) state, for example, when the voltage on node 703 is less than about a threshold voltage above the source of transistor 721, node 223 will essentially be undefined (i.e., "floating" voltage essentially defined by sub-threshold leakage currents).

Transistor 721 may modify the output from the VWL level shifter 232 before providing the pull-down control signal to transistor 221. Consider, for example, case 2 of Table 1 above, when the input 201 of the word line driver circuit 700 is equal to about 0 volts. As apparent from Table 1, the respective magnitudes of the gate-to-source voltage (G to S 221) and the gate-to-drain voltage (G to D 221) of transistor 221 are greater than VDD (e.g., about 1.1 volts). In order for a thin-oxide transistor to be employed for transistor 221, which reduces the fall time of the word line 105, these gate-to-source and gate-to-drain voltages should be reduced to a maximum of VDD.

In case 2 of Table 1, with the input 201 equal to about 0 volts, the output of the VWL level shifter 232 driving the drain of pull-down gate clamp transistor 721 will be about 1.1 volts (VDD). Transistor 721 is operative to shift the 1.1 volts received at it drain to about a threshold voltage ($V_{T721}$) below the voltage of the common gate node 703. By way of example only, node 703 is preferably set to a voltage of about 0.7 volt. A voltage of about 0.7 volt for node 703 is consistent with the pull-up clamp voltage level (VPU) and pull-down clamp voltage level (VPD), which are the voltages that nodes 203 and 204, respectively, are set to in case 2. For case 2, with the input 201 equal to about 0 volts, node 703 voltage equal to about 0.7 volt, and a threshold voltage for transistor 721 of about 0.2 volt, the gate voltage of transistor 221 will be about 0.5 volt (i.e., about 0.7V−0.2V). Thus, the magnitude of the gate-to-source voltage and the magnitude of the gate-to-drain voltage for transistor 221 will be about 0.85 volts (i.e., about 0.5V−VWL), below the prescribed 1.1-volt limit for thin-oxide transistors.

Thus, the pull-down control signal supplied to node 223 is limited by the pull-down clamp transistor 721 to an upper level equal to approximately $V_{T721}$ below a voltage level applied to the gate of transistor 721 at node 703), and a voltage difference between the source and gate of transistor 221 is limited to approximately a difference between VWL and a threshold voltage ($V_{T721}$) below the voltage applied to the gate of transistor 721. In this example, $V_{T721}$ is indicative of the threshold voltage of transistor 721.

During the time the word line 150 is not active (e.g., about the time that the input 201 equals about 0 volts), sub-threshold leakage current through the pull-down gate clamp transistor 721 may increase the voltage on node 223 above a threshold voltage below the common gate node 703 voltage (e.g., above about 0.5 volt). However, in case 2, the increase in voltage of node 223 would have to be greater than about 0.25 volt for the source- or drain-to-gate voltage of transistor 221 to be above 1.1 volts. Particularly in a DRAM application, this can be avoided (but, of course, should be simulated) given that the duration of time that the word line 150 remains inactive is limited by DRAM refresh operations that occur with a frequency sufficient to maintain data in the DRAM cells, for example, every 40 microseconds. This time can be short enough so that the sub-threshold leakage current does not raise the voltage on node 223 by 0.25 volt. Sub-threshold leakage current through transistor 721 is minimized through proper design of transistor 721, such as, for example, by utilizing a longer channel length (e.g., about ten percent longer than a prescribed minimum channel length) and/or a higher threshold voltage sufficient to ensure that the sub-threshold leakage current is below the prescribed level defined by the retention time in combination with the total capacitance of node 223.

For word line driver 700, as described above considering case 2, the magnitudes (i.e., absolute values) of the gate-to-drain and gate-to-source voltages for each of the transistors 211, 212, 221 and 222 do not exceed one-half of VPP minus one-half of VWL (i.e., VPP/2−VWL/2), or about 1.05 volts, either when the word line 150 is driven to or maintained at high (e.g., VPP) or low (e.g., VWL) levels. Note that the gate-to-source and gate-to-drain voltages for each of the transistors 211, 212, 221 and 222 does not exceed VDD (e.g., 1.1 volts), and thus does not exceed the prescribed voltage limit for a thin-oxide transistor.

The exemplary embodiment depicted in FIG. 7A utilizes a common PU/PD clamp gate signal VREF which is applied to the respective gates of transistors 711, 212, 721 and 222 at node 703. It is to be appreciated, however, that the same control signal need not be applied to each of these transistors and that, in alternative embodiments of the invention, a plurality of different control signals may be employed.

Figure 7B:
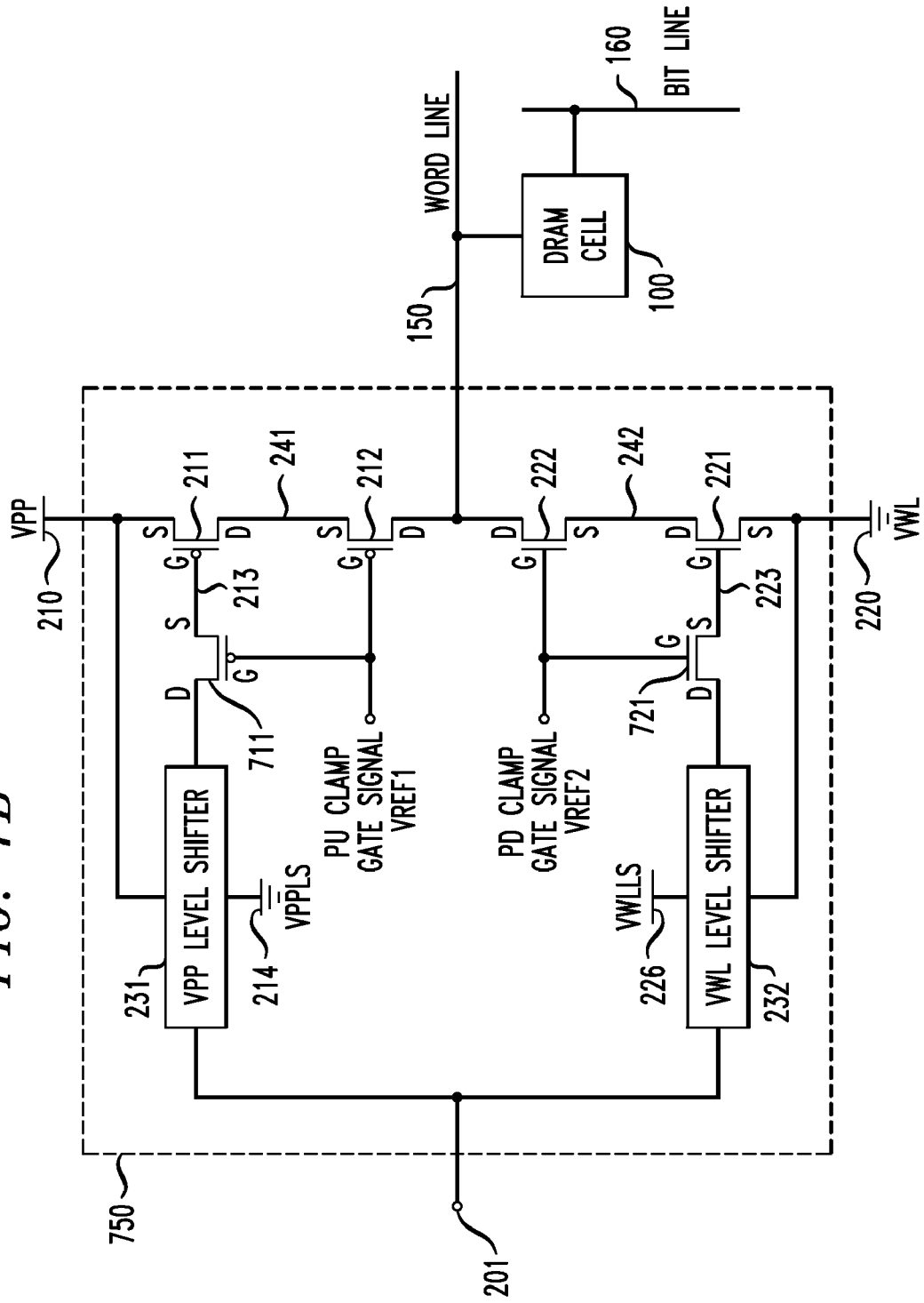
FIG. 7B is a schematic diagram depicting at least a portion of an exemplary word line driver circuit including a pull-up gate clamp transistor and a pull-down gate clamp transistor, according to another embodiment of the present invention.

For example, FIG. 7B depicts an illustrative embodiment of an exemplary write driver circuit 750 which is essentially identical to the write driver circuit 700 shown in FIG. 7A, except that the gates of transistors 711, 721, 212 and 222, are not all connected together at a common node (e.g., 703). Rather, the gates of PMOS transistors 711 and 212 are connected together and adapted to receive a first control signal, which may be a pull-up (PU) clamp gate signal, VREF1, and the gates of NMOS transistors 721 and 222 are connected together and adapted to receive a second control signal, which may be a pull-down (PD) clamp gate signal, VREF2. Control signals VREF1 and VREF2 are preferably DC voltages, VREF1 being different than VREF2. The invention is not limited to any specific voltage levels for signals VREF1 and VREF2.

Figure 7C:
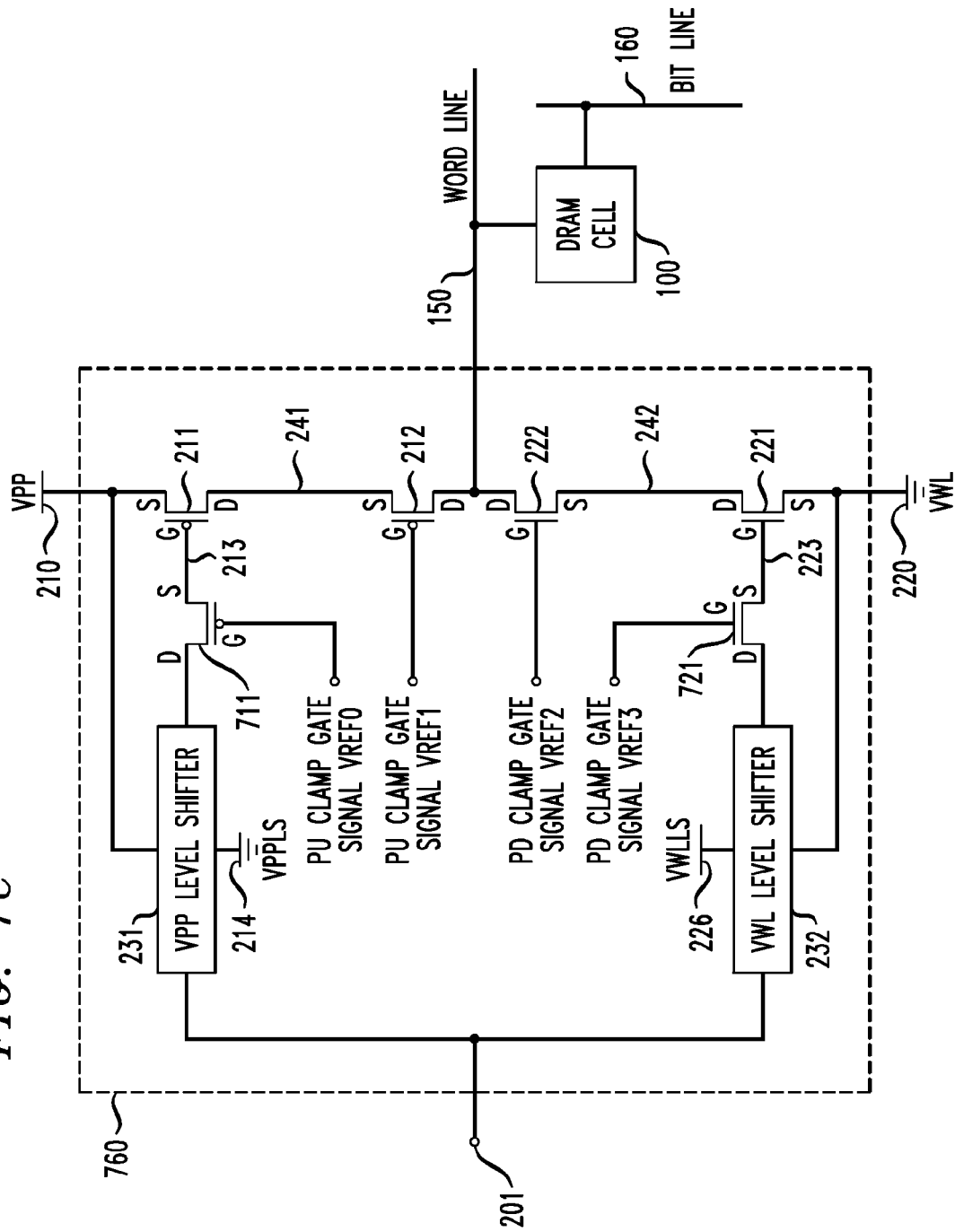
FIG. 7C is a schematic diagram depicting at least a portion of an exemplary word line driver circuit including a pull-up gate clamp transistor and a pull-down gate clamp transistor, according to yet another embodiment of the present invention.

Similarly, FIG. 7C depicts an illustrative embodiment of an exemplary write driver circuit 760 which is essentially identical to the write driver circuit 700 shown in FIG. 7A, except that the gates of transistors 711, 721, 212 and 222, are not all connected together at a common node. Rather, the gate of PMOS transistor 711 is adapted to receive a first control signal, which may be a pull-up (PU) clamp gate signal, VREF0, the gate of PMOS transistor 212 is adapted to receive a second control signal, which may be a PU clamp gate signal, VREF1, the gate of NMOS transistor 222 is adapted to receive a third control signal, which may be a pull-down (PD) clamp gate signal, VREF2, and the gate of NMOS transistor 721 is adapted to receive a fourth control signal, which may be a PD clamp gate signal, VREF3. Each of these control signals, VREF0 through VREF3, is preferably a DC voltage, VREF0 through VREF3 preferably being different from one another. The invention is not limited to any specific voltage levels for signals VREF0 through and VREF3.

With at least two exceptions, the magnitudes of the source-to-drain voltages of transistors 211, 212, 221 and 222 do not exceed about VDD (1.1 volts) and are at most one-half of VPP minus one-half of VWL (i.e., VPP/2−VWL/2), or about 1.05 volts in this illustrative embodiment. The two exceptions are the magnitude of the source-to-drain voltage difference of the pull-up clamp transistor 212 and the magnitude of the source-to-drain voltage difference of pull-down clamp transistor 222, both having a maximum magnitude of source-to-drain voltage difference of about 1.25 volts. As described above with reference to case 3, this source to drain voltage difference of 1.25 volts can be supported or accommodated by an appropriate selection of channel length for transistors 212 and 222. Therefore, thin-oxide transistors may be used for transistors 211, 212, 221 and 222. Transistors 211 and 221 may be thin-oxide transistors designed to support VDD voltage levels (e.g., having minimum channel lengths as specified by the IC fabrication technology for thin-oxide transistors designed to support VDD). Transistors 212 and 222 may be conventional thin-oxide transistors having channel lengths sufficiently sized to support the higher source-to-drain voltages of the transistors 212 and 222, for example, to support about 1.25 volts. It should be recognized that, if VPPLS=GND=0V and VWLLS=VDD=1.1V in this example, the transistors within the level shifters 300 and 400 must still be thick-oxide transistors.

It is also contemplated, for certain applications, that pull-down gate clamp transistor 721 be removed from the word line driver 700 of FIG. 7 and that transistors 222 and 221 become thick-oxide transistors. In essence, the output driver stage can be hybrid of a thin-oxide pull-up transistors 211 and 212 and thick-oxide pull-down transistors 222 and 221. The resulting word line driver circuit would have a fast rise time overall but would not require the management of sub-threshold leakage currents (associated with retention time) for transistor 721.

DRAM circuits comprising at least one word line coupled to at least one DRAM cell and to at least one word line driver circuit in accordance with the invention (e.g., word line driver circuits 200, 600 or 700) are considered embodiments of the present invention.

At least a portion of the techniques of the present invention may be implemented in one or more integrated circuits. As is known in the art, integrated circuits comprise semiconductor structures. Such semiconductor structures may comprise a substrate and circuits formed within or upon the substrate, for example, one or more word line driver circuits or DRAM circuits in accordance with the invention. In forming integrated circuits, die are typically fabricated in a repeated pattern on a surface of a semiconductor wafer. Each of the die includes a device described herein, and may include other structures or circuits, for example, word line driver circuits according to embodiments of the invention (e.g., illustrative word line driver circuits 200, 600 and 700), or DRAM circuits comprising at least one word line coupled to at least one DRAM cell and to at least one word line driver circuit in accordance with the invention. Individual die are cut or diced from the wafer, then packaged as integrated circuits. One skilled in the art would know how to dice wafers and package die to produce integrated circuits. Integrated circuits so manufactured are considered part of this invention.

Figure 8:
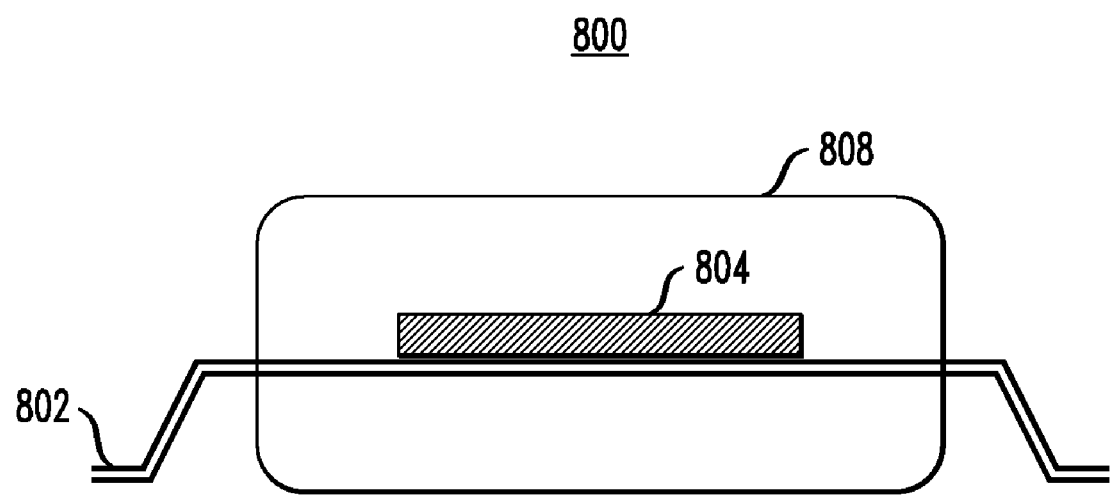
FIG. 8 is a cross-sectional view depicting at least a portion of an exemplary packaged IC device including at least one word line driver circuit formed in accordance with an embodiment of the present invention.

FIG. 8 is a cross-sectional view depicting at least a portion of an exemplary packaged integrated circuit device 800 including at least one word line driver circuit formed in accordance with an embodiment of the present invention. The integrated circuit comprises a circuit or device of the present invention. In forming integrated circuits, die are typically fabricated in a repeated pattern on a surface of a semiconductor wafer. Individual chip die are cut or diced from the wafer, then packaged as integrated circuits.

Specifically, the packaged integrated circuit 800 comprises a substrate or leadframe 802, a chip die 804, and a molded encapsulation 808. The chip die 804 comprises at least one word line driver circuit formed in accordance with techniques of the invention, such as, but not limited to, word line driver circuits 200, 600 or 700, or for another example, a DRAM comprising a word line driver in accordance with the invention. The integrated circuit may further comprise a processing device coupled to the DRAM. One skilled in the art would know how to dice wafers to produce integrated circuits. Integrated circuits so manufactured are considered part of this invention. Although only one type of integrated circuit package is shown, the invention is not so limited; rather, the invention may comprise an integrated circuit die enclosed in any package type.

An integrated circuit in accordance with techniques of the present invention can be employed in conjunction with essentially any apparatus, application and/or electronic system which utilizes memory, particularly DRAM, either embedded or discrete. Suitable systems for implementing the invention may include, but are not limited to, personal computers, communication networks, electronic commerce systems, portable communications devices (e.g., cell phones), solid-state media storage devices, etc. Systems incorporating such integrated circuits are considered part of this invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A word line driver circuit adapted for connection to a corresponding word line in a memory circuit, the word line driver circuit comprising:
   a first transistor including a first source/drain coupled to a first voltage supply providing a first voltage level, a second source/drain, and a gate adapted to receive a first control signal which varies as a function of an input signal supplied to the word line driver circuit;
   a second transistor including a first source/drain connected to the second source/drain of the first transistor, a second source/drain coupled to the corresponding word line, and a gate adapted to receive a first clamp signal;
   a third transistor including a first source/drain coupled to the corresponding word line, a second source/drain, and a gate adapted to receive a second clamp signal; and
   a fourth transistor including a first source/drain connected to the second source/drain of the third transistor, a second source/drain coupled to a second voltage supply providing a second voltage level, and a gate adapted to receive a second control signal which varies as a function of the input signal;
   wherein the first clamp signal is set to a third voltage level configured such that a voltage difference between the first and second source/drains of the first transistor is less than a voltage difference between the first and second voltage supplies, and wherein the second clamp voltage is set to a fourth voltage level configured such that a voltage difference between the first source/drain and the second source/drain of the fourth transistor is less than the voltage difference between the first and second voltage supplies.

2. The word line driver circuit of claim 1, wherein each of the first, second, third and fourth transistors is a thin-oxide MOS transistor.

3. The word line driver circuit of claim 1, wherein each of the first and second transistors is a thin-oxide PMOS transistor, and each of the third and fourth transistors is a thin-oxide NMOS transistor.

4. The word line driver circuit of claim 1, wherein the first voltage level is higher than the second, third and fourth voltage levels, and wherein the second voltage level is lower than the third and fourth voltage levels.

5. The word line driver circuit of claim 1, wherein the fourth voltage level is between the first and third voltage levels.

6. The word line driver circuit of claim 1, wherein the third and fourth voltage levels are about equal to one another.

7. The word line driver circuit of claim 1, wherein the third and fourth voltage levels are equal to approximately one-half of the first voltage level plus one-half of the second voltage level.

8. The word line driver circuit of claim 1, wherein at least one of: (i) a lower limit of a voltage on the second source/drain of the first transistor is defined by the third voltage level plus a magnitude of a threshold voltage of the second transistor; and (ii) an upper limit of a voltage on the first source/drain of the fourth transistor is defined by the fourth voltage level minus a magnitude of a threshold voltage of the fourth transistor.

9. The word line driver circuit of claim 2, wherein a magnitude of a difference between a voltage on the gate and a voltage on the first source/drain, and a magnitude of a difference between a voltage on the gate and a voltage on the second source/drain for each of the first, second, third and fourth transistors has an upper limit equal to about one-half of the first voltage level minus one-half of the second voltage level.

10. The word line driver circuit of claim 1, further comprising at least one of:
a first voltage level shifter circuit coupled to the gate of the first transistor, the first voltage level shifter circuit being operative to receive the input signal referenced to a first set of signal levels and to generate the first control signal referenced to a second set of signal levels; and
a second voltage level shifter circuit coupled to the gate of the fourth transistor, the second voltage level shifter circuit being operative to receive the input signal referenced to the first set of signal levels and to generate the second control signal referenced to a third set of signal levels.

11. The word line driver circuit of claim 1, wherein the first voltage level shifter circuit includes a first voltage supply node coupled to the first voltage supply providing the first voltage level and a second voltage supply node coupled to a third voltage supply providing a fifth voltage level, the fifth voltage level being less than the first voltage level, and wherein the second voltage level shifter circuit includes a first voltage supply node coupled to a fourth voltage supply providing a sixth voltage level and a second voltage supply node coupled to the second voltage supply providing the second voltage level, the sixth voltage level being greater than the second voltage level.

12. The word line driver circuit of claim 1, further comprising a switching circuit coupled to the gate of the second transistor, the switching circuit being operative to generate the first clamp signal which switches between the third voltage level and a fifth voltage level as a function of the input signal supplied to the word line driver circuit, the fifth voltage level being less than the third voltage level.

13. The word line driver circuit of claim 12, wherein the word line driver circuit is operative: (i) to drive the corresponding word line to a first word line voltage level when the first clamp signal is at the third voltage level; and (ii) to drive the corresponding word line to a second word line voltage level when the first clamp signal is at the fifth voltage level.

14. The word line driver circuit of claim 13, wherein the first word line voltage level is substantially equal to the first voltage level, and the second word line voltage level is substantially equal to the second voltage level.

15. The word line driver circuit of claim 1, wherein at least one of:
the first control signal has a lower limit substantially equal to a magnitude of a threshold voltage of the first transistor above the first clamp signal; and
the second control signal has an upper limit substantially equal to a magnitude of a threshold voltage of the fourth transistor below the second clamp signal.

16. The word line driver circuit of claim 1, further comprising at least one of:
a fifth transistor including a first source/drain connected to the gate of the first transistor, a second source/drain for receiving the first control signal, and a gate for receiving a third clamp signal, a voltage applied to the gate of the first transistor having a lower limit substantially equal to a magnitude of a threshold voltage of the fifth transistor above the third clamp signal; and
a sixth transistor including a first source/drain connected to the gate of the fourth transistor, a second source/drain for receiving the second control signal, and a gate for receiving a fourth clamp signal, the second control signal having an upper limit substantially equal to a magnitude of a threshold voltage of the sixth transistor below the fourth clamp signal.

17. The word line driver circuit of claim 16, wherein the first, second, third and fourth third clamp signals are substantially equal to one another.

18. The word line driver circuit of claim 16, wherein the third clamp signal is substantially equal to the first clamp signal, and wherein the fourth clamp signal is substantially equal to the second clamp signal.

19. The word line driver circuit of claim 16, wherein at least a given one of the first, second, third, fourth, fifth and sixth transistors comprises a thin-oxide MOS transistor adapted to withstand a voltage difference between any two of the first source/drain, second source/drain and gate thereof that is less than a magnitude of a difference between the first and second voltage levels.

20. A memory circuit, comprising:
at least one word line;
at least one memory cell coupled to the at least one word line; and
at least one word line driver circuit coupled to the at least one word line, the at least one word line driver circuit comprising:
a first transistor including a first source/drain coupled to a first voltage supply providing a first voltage level, a second source/drain, and a gate adapted to receive a first control signal which varies as a function of an input signal supplied to the word line driver circuit;
a second transistor including a first source/drain connected to the second source/drain of the first transistor, a second source/drain coupled to the corresponding word line, and a gate adapted to receive a first clamp signal;
a third transistor including a first source/drain coupled to the corresponding word line, a second source/drain, and a gate adapted to receive a second clamp signal; and
a fourth transistor including a first source/drain connected to the second source/drain of the third transistor, a second source/drain coupled to a second voltage supply providing a second voltage level, and a gate adapted to receive a second control signal which varies as a function of the input signal;

wherein the first clamp signal is set to a third voltage level configured such that a voltage difference between the first and second source/drains of the first transistor is less than a voltage difference between the first and second voltage supplies, and wherein the second clamp voltage is set to a fourth voltage level configured such that a voltage difference between the first source/drain and the second source/drain of the fourth transistor is less than the voltage difference between the first and second voltage supplies.

21. An integrated circuit, comprising:
an embedded memory; and
at least one word line driver circuit connected to a corresponding word line in the embedded memory, the at least one word line driver circuit comprising:
  a first transistor including a first source/drain coupled to a first voltage supply providing a first voltage level, a second source/drain, and a gate adapted to receive a first control signal which varies as a function of an input signal supplied to the word line driver circuit;
  a second transistor including a first source/drain connected to the second source/drain of the first transistor, a second source/drain coupled to the corresponding word line, and a gate adapted to receive a first clamp signal;
  a third transistor including a first source/drain coupled to the corresponding word line, a second source/drain, and a gate adapted to receive a second clamp signal; and
  a fourth transistor including a first source/drain connected to the second source/drain of the third transistor, a second source/drain coupled to a second voltage supply providing a second voltage level, and a gate adapted to receive a second control signal which varies as a function of the input signal;
  wherein the first clamp signal is set to a third voltage level configured such that a voltage difference between the first and second source/drains of the first transistor is less than a voltage difference between the first and second voltage supplies, and wherein the second clamp voltage is set to a fourth voltage level configured such that a voltage difference between the first source/drain and the second source/drain of the fourth transistor is less than the voltage difference between the first and second voltage supplies.

22. The integrated circuit of claim 21, wherein the embedded memory comprises a dynamic random access memory.

* * * * *